United States Patent
Maruyama et al.

(10) Patent No.: US 6,675,666 B2
(45) Date of Patent: Jan. 13, 2004

(54) SUBSTRATE TRANSPORTATION APPARATUS

(75) Inventors: Norio Maruyama, Hachioji (JP); Daisuke Yokoi, Yokohama (JP); Yasuo Mori, Suwa-gun (JP); Yoshihisa Taniguchi, Okaya (JP)

(73) Assignee: Olympus Optical Co., Ltd., Tokyo (JP)

( * ) Notice: Subject to any disclaimer, the term of this patent is extended or adjusted under 35 U.S.C. 154(b) by 30 days.

(21) Appl. No.: 10/137,046

(22) Filed: May 1, 2002

(65) Prior Publication Data

US 2002/0134179 A1 Sep. 26, 2002

Related U.S. Application Data

(63) Continuation of application No. PCT/JP01/07737, filed on Sep. 6, 2001.

(30) Foreign Application Priority Data

| Sep. 6, 2000 | (JP) | 2000-270330 |
| Sep. 14, 2000 | (JP) | 2000-280883 |
| Sep. 20, 2000 | (JP) | 2000-285640 |

(51) Int. Cl.[7] ............................ G01M 19/00; B65H 1/00
(52) U.S. Cl. .................... 73/865.8; 414/226.05
(58) Field of Search ............. 73/865.8; 414/744.1, 414/744.2, 212, 217, 222.01, 226.04, 226.05

(56) References Cited

U.S. PATENT DOCUMENTS

| 4,923,054 A | * | 5/1990 | Ohtani et al. | 187/267 |
| 5,310,410 A | * | 5/1994 | Begin et al. | 29/25.01 |
| 5,610,683 A | * | 3/1997 | Takahashi | 355/53 |
| 5,612,068 A | | 3/1997 | Kempf et al. | |
| 5,807,062 A | | 9/1998 | Schultz et al. | |
| 5,951,770 A | * | 9/1999 | Perlov et al. | 118/719 |
| 6,007,675 A | * | 12/1999 | Toshima | 156/345.32 |
| 6,155,768 A | * | 12/2000 | Bacchi et al. | 414/416.03 |
| 6,405,610 B1 | * | 6/2002 | Komatsu et al. | 73/865.9 |
| 6,511,315 B2 | * | 1/2003 | Hashimoto | 432/121 |

FOREIGN PATENT DOCUMENTS

| JP | 406342837 A | * | 12/1994 | H01L/21/66 |
| JP | 09-270383 A | | 10/1997 | |
| JP | 10-031316 A | | 2/1998 | |
| JP | 10-163300 A | | 6/1998 | |

* cited by examiner

Primary Examiner—Hezron Williams
Assistant Examiner—Charles D Garber
(74) Attorney, Agent, or Firm—Frishauf, Holtz, Goodman & Chick, P.C.

(57) ABSTRACT

This invention provides a substrate transportation apparatus in which a loader and macroinspection/transportation section are separate to be independent of each other. The loader can be arranged on the left side or rear side of the macroinspection/transportation section when seen from the front side. The substrate transportation apparatus can easily be changed in accordance with various types of specifications of apparatus layout.

8 Claims, 17 Drawing Sheets

SUBSTRATE TRANSPORTATION APPARATUS

CROSS REFERENCE TO RELATED APPLICATIONS

This is a Continuation Application of PCT Application No. PCT/JP01/07737, filed Sep. 6, 2001, which was not published under PCT Article 21(2) in English.

This application is based upon and claims the benefit of priority from the prior Japanese Patent Applications No. 2000-270330, filed Sep. 6, 2000; No. 2000-280883, filed Sep. 14, 2000; No. 2000-285640, filed Sep. 20, 2000; and No. 2000-285988, filed Sep. 20, 2000, the entire contents of all of which are incorporated herein by reference.

BACKGROUND OF THE INVENTION

1. Field of the Invention

The present invention relates to a substrate transportation apparatus for transporting a substrate to an apparatus unit in order to inspect and measure, e.g., a semiconductor wafer or a glass substrate for a flat panel display such as a liquid crystal display by visual observation or using a microscope.

2. Description of the Related Art

FIG. 20 is a view showing the arrangement of a semiconductor wafer outer appearance inspection apparatus. A wafer carrier 1 is formed on an outer appearance inspection apparatus frame 2. The wafer carrier 1 forms a cassette.

The wafer carrier 1 has an uninspected wafer carrier 1a and inspected wafer carrier 1b. The uninspected wafer carrier 1a stores an uninspected semiconductor wafer 3. Regarding the semiconductor wafer 3, an uninspected semiconductor wafer will be referred to as a semiconductor wafer 3a.

A transportation robot 4 is provided on the outer appearance inspection apparatus frame 2. The transportation robot 4 has an X-movable shaft 4a and Y-movable shaft 4b. The Y-movable shaft 4b can move on the X-movable shaft 4a in the X-axis direction. A robot arm 5 is formed on the Y-movable shaft 4b and can move in the Y-axis direction. A hand 5a is provided to the robot arm 5. The hand 5a holds the semiconductor wafer 3.

A three-arm transportation apparatus 6 is provided between the transportation robot 4 and a microinspection section 9 (to be described later). The three-arm transportation apparatus 6 circularly transports the semiconductor wafer 3 among a wafer transfer position $P_1$, macroinspection position $P_2$, and microinspection/transfer position $P_3$.

The three-arm transportation apparatus 6 has three transportation arms 6a, 6b, and 6c equiangularly, e.g., at every 120°, with respect to a shaft 8. The transportation arms 6a, 6b, and 6c have Y-shaped hands (with wafer chucks) 7a, 7b, and 7c, respectively.

The microinspection section 9 is provided on the outer appearance inspection apparatus frame 2. The microinspection section 9 receives the semiconductor wafer 3 held on the hand 7a, 7b, or 7c positioned at the microinspection/transfer position $P_3$, and inspects it by using a microscope.

The microinspection section 9 can sense the image of the semiconductor wafer 3 enlarged by the microscope with a CCD camera or the like, and can observe it through eyepieces 10.

The operation will be described.

At the macroinspection position $P_2$, macroinspection of the semiconductor wafer 3 is performed by the inspector through visual observation.

At the microinspection/transfer position $P_3$, the semiconductor wafer 3 is transferred to the microinspection section 9. The microinspection section 9 enlarges the image of the semiconductor wafer 3 by the objective lens of the microscope and senses it with the CCD camera or the like. At the microinspection section 9, microinspection is performed by the inspector through the eyepieces 10.

When macroinspection and microinspection are ended, the three-arm transportation apparatus 6 rotates, e.g., counterclockwise on the sheet of drawing, about the shaft 8 as the center. Thus, the hand 7a is positioned at the macroinspection position $P_2$. The hand 7b is positioned at the microinspection/transfer position $P_3$. The hand 7c is positioned at the wafer transfer position $P_1$.

The robot arm 5 is driven by the transportation robot 4 to move to the wafer transfer position $P_1$ (indicated by a broken line). The robot arm 5 positions the hand 5a so as to enter the Y-shaped opening of the hand 7c, and receives an inspected semiconductor wafer 3b from the hand 7c.

Then, the robot arm 5 is driven by the transportation robot 4 to move to a position corresponding to the inspected wafer carrier 1b, and stores the inspected semiconductor wafer 3b in the inspected wafer carrier 1b.

Subsequently, the robot arm 5 is driven by the transportation robot 4 to move to a position corresponding to the uninspected wafer carrier 1a, and holds the uninspected semiconductor wafer 3a (second semiconductor wafer) stored in the uninspected wafer carrier 1a.

While holding the uninspected semiconductor wafer 3a, the robot arm 5 is driven by the transportation robot 4 to move to a position corresponding to the wafer transfer position $P_1$.

The robot arm 5 positions the hand 5a which holds the semiconductor wafer 3a so as to enter the Y-shaped opening of the hand 7c, and transfers the semiconductor wafer 3a to the transportation arm 6c.

At the macroinspection position $P_2$, the next semiconductor wafer 3 is macroinspected by the inspector through visual observation.

At the microinspection/transfer position $P_3$, the next semiconductor wafer 3 is transferred to the microinspection section 9 and microinspected by the microscope.

After this, at the wafer transfer position $P_1$, the uninspected and inspected semiconductor wafers 3a and 3b are transferred. At the macroinspection position $P_2$, macroinspection is performed. At the microinspection/transfer position $P_3$, transfer to the microinspection section 9 is sequentially performed.

In an inspection process at a semiconductor manufacturing factory, the apparatus layout and design specifications are changed in accordance with the line layout change and various types of specifications (types). In the above apparatus, the wafer carrier 1, transportation robot 4, three-arm transportation apparatus 6, macroinspection section, and microinspection section 9 are integrally formed on the outer appearance inspection apparatus frame 2. A change in specifications of this arrangement cannot be easily coped with.

Therefore, apparatuses with different numbers of wafer carriers 1 at different positions must be manufactured to match the individual orders in accordance with the line layout of the inspection process and various types of specifications.

In addition, the design specifications of the apparatus differ in accordance with the various types of specifications, and the number of constituent components of the respective apparatuses that are not common increases.

BRIEF SUMMARY OF THE INVENTION

It is an object of the present invention to provide a highly versatile substrate transportation apparatus which can cope with various types of specifications by minimum design changes.

The present invention provides a substrate transportation apparatus comprising a first transportation section which extracts/stores a substrate from/in a storing container that stores the substrate, and a second transportation section which transfers the substrate with respect to the first transportation section and transfers the substrate with respect to an apparatus unit that performs a desired process for the substrate, wherein the second transportation section has a rotation arm which is circularly transported between a substrate transfer position with respect to the first transportation section and a substrate transfer position with respect to the apparatus unit, the first transportation section is separated from the second transportation section, and a transfer position with respect to the rotation arm is located within a transportation stroke range for the first transportation section with respect to two different directions such that the first transportation section can be selectively arranged with respect to the second transportation section in the two different directions.

In a substrate transportation apparatus according to another aspect of the present invention, the second transportation section is integrated with the apparatus unit, the transfer position with respect to the rotation arm is set at a same distance from two adjacent side surfaces of the apparatus unit, and the first transportation section can be arranged on the two adjacent side surfaces.

In a substrate transportation apparatus according to another aspect of the present invention, an interval between the first transportation section and the transfer position with respect to the rotation arm is set within the transportation stroke range for the first transportation section.

In a substrate transportation apparatus according to another aspect of the present invention, an alignment sensor which detects an outer peripheral edge of the substrate in order to align a central position of the substrate is arranged at the substrate transfer position of the second transportation section.

In a substrate transportation apparatus according to another aspect of the present invention, an arm of the first transportation section or the arm of the second transportation section has a hand formed in a substantially L shape to draw and hold the substrate by suction, and a line that connects two suction holes formed at two edges of the substantially L-shaped hand is located outside a center of the substrate.

In a substrate transportation apparatus according to another aspect of the present invention, an arm of the first transportation section and the arm of the second transportation section have each a hand formed in a substantially L shape to draw by suction and hold the substrate, the hand of the second transportation section is arranged at the substrate transfer position not to interfere with the hand of the first transportation section upon inserting the hand of the first transportation section from the two different directions, and a line that connects two suction holes formed at two edges of each of the hands is located outside a center of the substrate.

In a substrate transportation apparatus according to another aspect of the present invention, the first transportation section includes an articulated-type transfer robot having a plurality of connection arms, and the apparatus includes a first hand formed with a curve at a distal end of the connection arms of the transfer robot to draw by suction and hold the substrate, a second hand connected to a distal end of the rotation arm and formed in a substantially L shape with a transfer space where the first hand is to enter from the two directions, to draw and hold the substrate by suction, and a relief which avoids interference with a long side of the second hand when the first hand transfers the substrate from an insertion direction of the long side of the second hand.

The present invention provides a substrate transportation apparatus used for performing macroobservation of inspecting a defect on a substrate by visual observation and various types of inspection and measurement for the substrate, comprising: a first transportation section which extracts/stores the substrate from/in a storing container that stores the substrate, and a second transportation section which transfers the substrate with respect to the first transportation section and transfers the substrate with respect to an apparatus unit that performs a desired process for the substrate, wherein the first transportation section includes a stretchable/contractible articulated arm in which a plurality of arms are connected, and a first hand formed with a curve at a distal end of the articulated arm to draw and hold the substrate by suction, the second transportation section includes a rotating shaft which rotates around an axial direction as a center, and three transportation arms formed on the rotating shaft at equiangular intervals and each having a second hand with a substantially L shape with a transfer space where the first hand is to enter, to draw by suction and hold the substrate, the three transportation arms are rotated around the rotating shaft as a center to circularly shift among a transfer position with respect to the first transportation section, a position for macroobservation, and a transfer position with respect to the second transfer section, the first and second transportation sections are separate to be independent of each other, the first transportation section is formed with respect to the second transportation section in a first transfer direction or a second transfer direction different from the first transfer direction by substantially 90°, the apparatus unit includes various types of units including a microinspection unit which enlarges the substrate by a microscope and observes an enlarged image of the substrate, and a thickness measurement unit which measures a thickness of a film formed on the substrate, and either one of the two units is incorporated in the second transportation section.

In the substrate transportation apparatus according to the present invention with the above arrangement, the first and second transportation sections are separate to be independent of each other. Thus, the first transportation section can be arranged with respect to the second transportation section in either one of two transfer directions. Therefore, various types of specifications can be coped with minimum design changes, so the versatility is increased.

DETAILED DESCRIPTION OF THE INVENTION

The first embodiment of the present invention will be described in detail with reference to the accompanying drawing.

Figure 1:
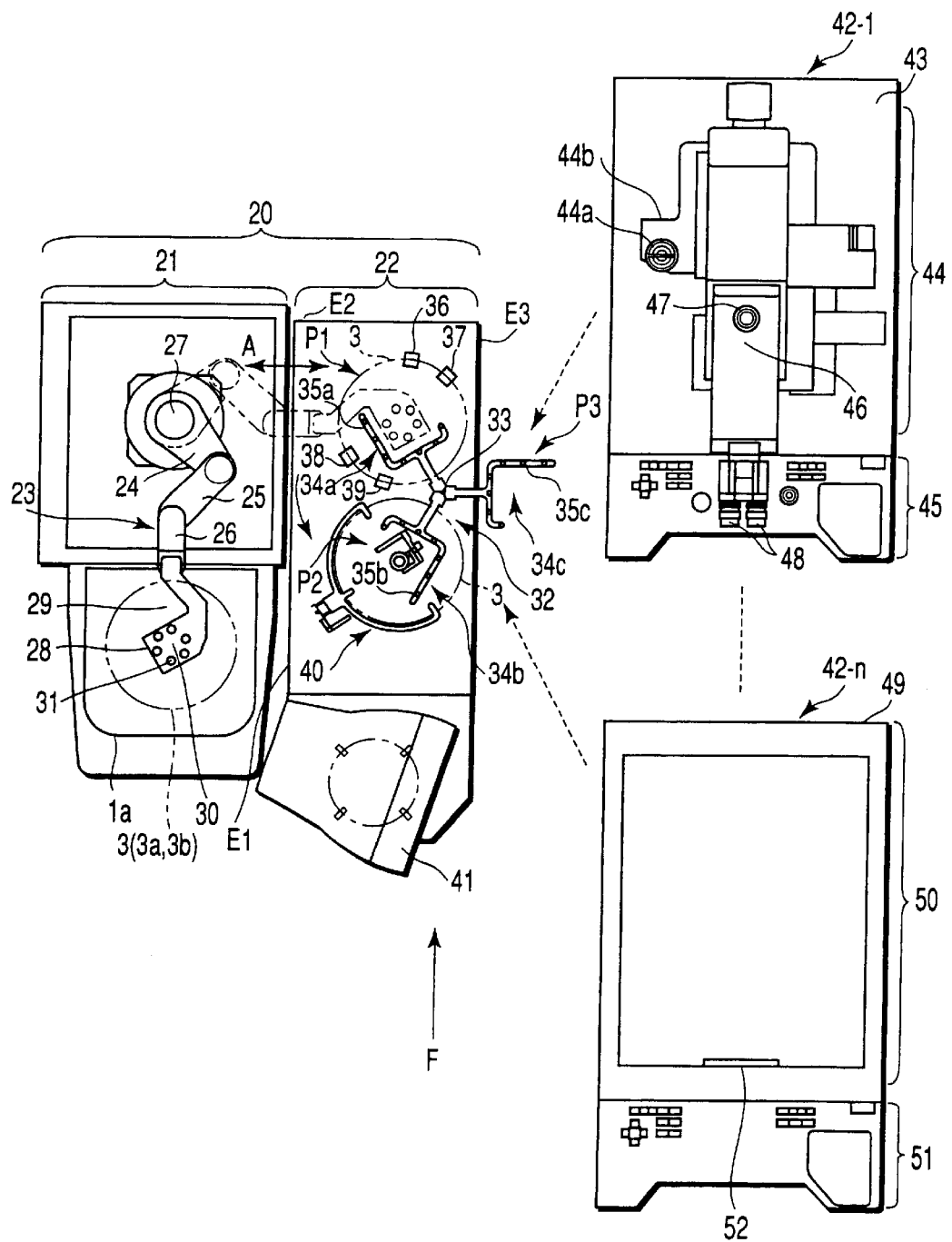
FIG. 1 is a view showing the overall arrangement of an outer appearance inspection apparatus of the first specification which uses a substrate transportation apparatus according to the first embodiment of the present invention.

FIG. 1 is a view showing the overall arrangement of an outer appearance inspection apparatus provided to an inspection process at a semiconductor manufacturing factory.

The outer appearance inspection apparatus has a substrate transportation apparatus 20 of the present invention. The apparatus layout of the outer appearance inspection apparatus corresponds to the first specification. According to the first specification, a loader 21 is provided on the left side when seen from a front side F, and one uninspected wafer carrier 1a is provided.

The wafer carrier 1a stores a plurality of semiconductor wafers 3a and 3b at predetermined pitches in the vertical direction.

In the substrate transportation apparatus 20, the loader 21 and a macroinspection/transportation section 22 are separate and independent of each other. The loader 21 corresponds to the first transportation section. The macroinspection/transportation section 22 corresponds to the second transportation section.

The loader 21 has a wafer transportation robot 23. The wafer transportation robot 23 extracts the uninspected semiconductor wafer 3a stored in the wafer carrier 1a and transfers it to the macroinspection/transportation section 22. The wafer transportation robot 23 also receives the inspected semiconductor wafer 3b from the macroinspection/transportation section 22 and stores it in the wafer carrier 1a.

The loader 21 can be arranged in two transfer directions with respect to the macroinspection/transportation section 22. With the first transfer direction, as shown in FIG. 1, the semiconductor wafer 3 is transferred with respect to the macroinspection/transportation section 22 from a left side A when seen from the front side F.

Figure 2:
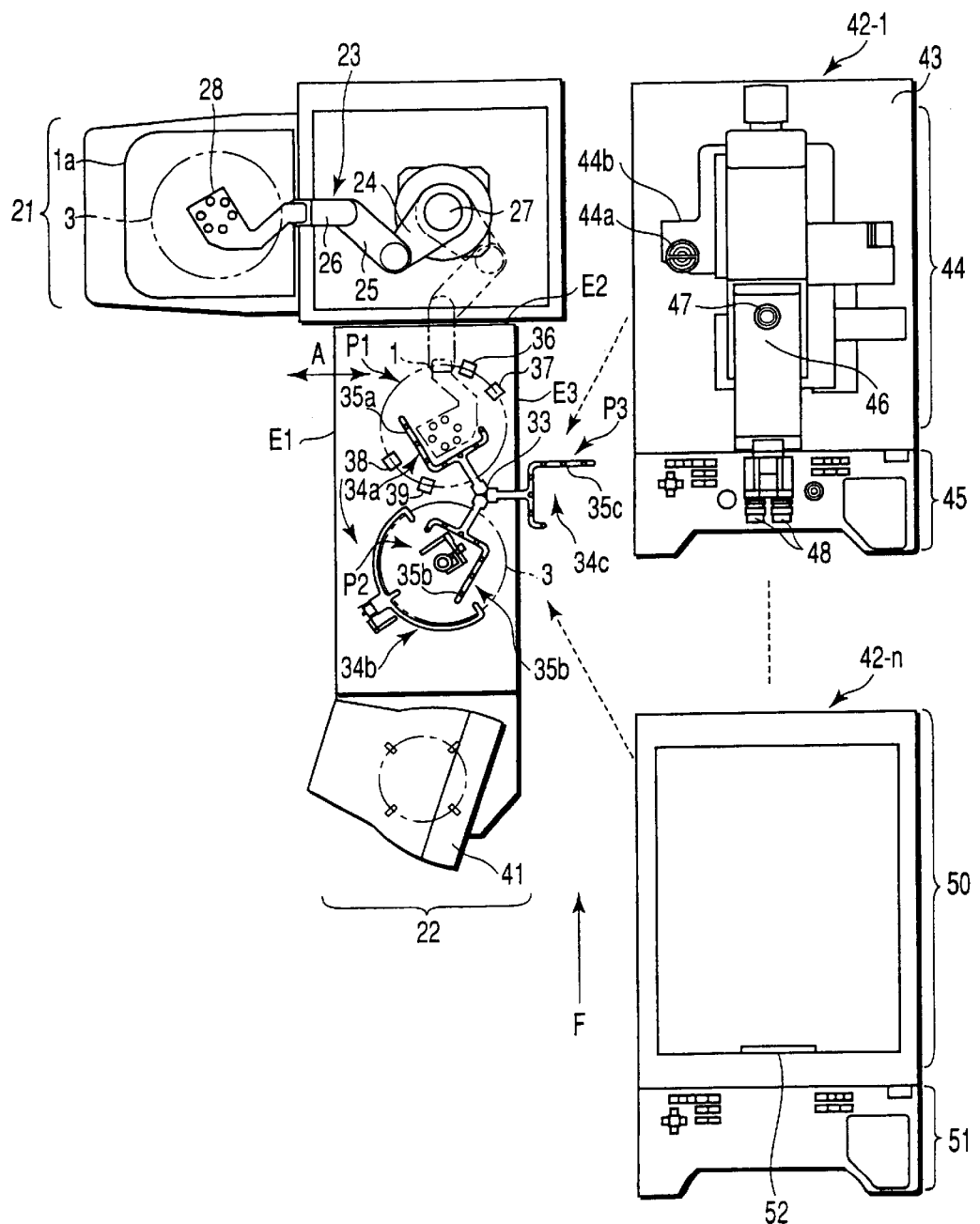
FIG. 2 is a view showing the overall arrangement of the outer appearance inspection apparatus of the second specification which uses the substrate transportation apparatus according to the first embodiment of the present invention.

With the second transfer direction, as shown in FIG. 2, a semiconductor wafer 3 is transferred from a rear side H of the macroinspection/transportation section 22. In this case, the loader 21 is arranged on the rear side H of the macroinspection/transportation section 22.

The apparatus layout shown in FIG. 2 corresponds to the second specification. According to the second specification, the loader 21 is arranged on the rear side H of the macroinspection/transportation section 22, and one wafer carrier 1a is provided.

Therefore, the substrate transportation apparatus 20 of the present invention can cope with the apparatus layouts of the first and second specifications.

The wafer transportation robot 23 is of an articulated type formed by connecting three connection arms 24 to 26. A robot arm is formed by connecting the connection arms 24 to 26.

More specifically, one end of the connection arm 24 is rotatably connected to a rotating shaft 27. The other end of the connection arm 24 is connected to one end of the connection arm 25 so that they are both rotatable. The other end of the connection arm 25 is connected to one end of the connection arm 26 so that they are both rotatable. The other end of the connection arm 26 is connected to a plate-like hand 28.

Figure 3:
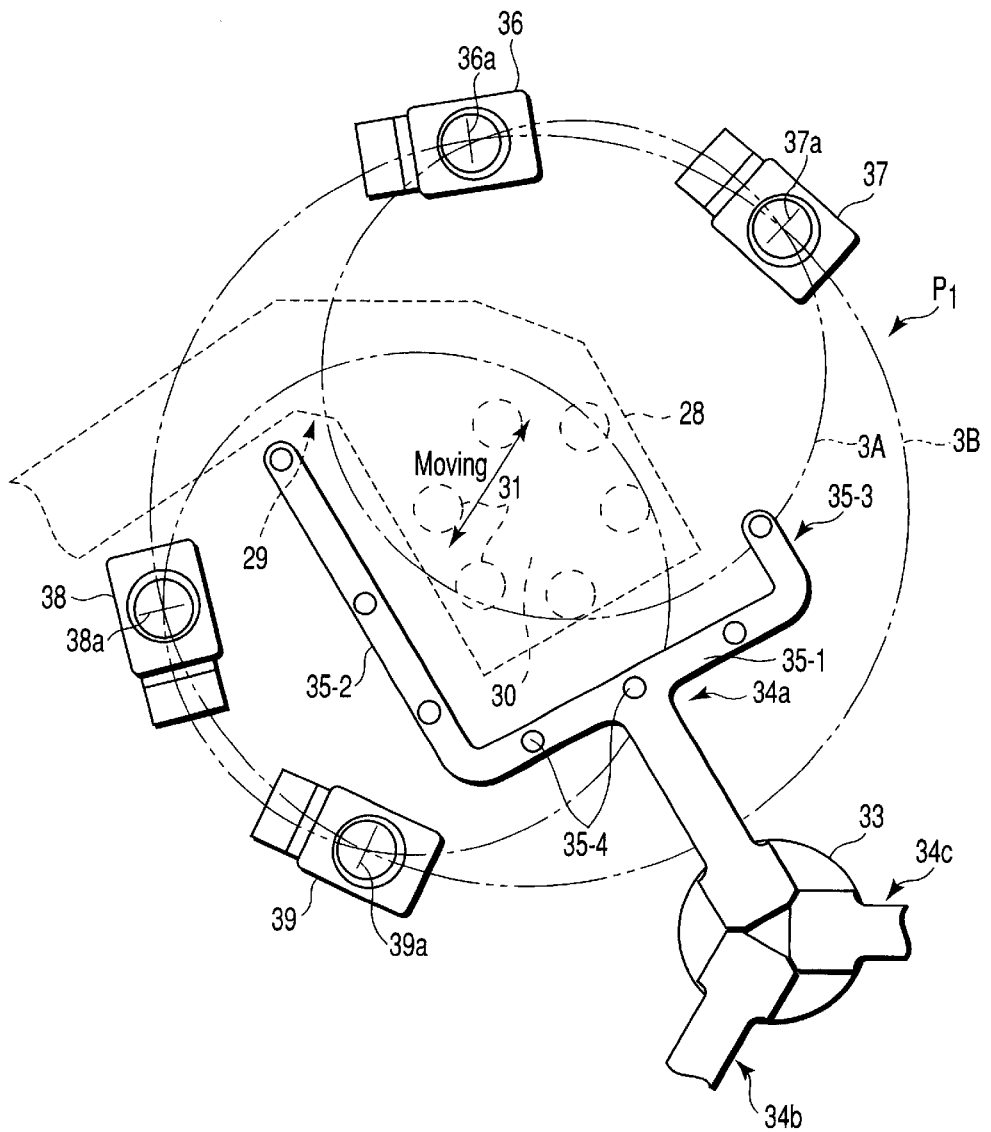
FIG. 3 is a view showing the positional relationship between the hand and non-contact position sensor in the substrate transportation apparatus according to the first embodiment of the present invention.

As shown in FIG. 3, in the plate-like hand 28, a V-shaped relief 29 and quadrilateral drawing portion 30 are continuously formed.

In the drawing portion 30, a plurality of suction holes (with suction pads) 31 are formed on one circle. These suction holes 31 are formed in that surface of the drawing portion 30 where the semiconductor wafer 3 is to be placed, and communicate with a suction pump (not shown).

The arrangement of the relief 29 will be described later.

The wafer transportation robot 23 stretches and contracts by rotating the connection arms 24 to 26 at their joints. When the wafer transportation robot 23 stretches and contracts, the moving range of the plate-like hand 28 becomes the transportation stroke range.

Therefore, with the first specification shown in FIG. 1, the wafer transportation robot 23 supplies/discharges the semiconductor wafer 3 to/from the macroinspection/transportation section 22 from the left side (direction of an arrow A).

With the second specification shown in FIG. 2, the wafer transportation robot 23 supplies/discharges the semiconductor wafer 3 to/from the macroinspection/transportation section 22 from the rear side (direction of an arrow H).

A wafer transportation apparatus 32 is provided on the frame of the macroinspection/transportation section 22. The wafer transportation apparatus 32 has a rotating shaft 33 which rotates about the axial it direction as the center. Three transportation arms 34a, 34b, and 34c are provided on the rotating shaft 33 equiangularly (e.g., 120°).

The transportation arms 34a, 34b, and 34c respectively have L-shaped, L-type hands (with wafer chucks) 35a, 35b, and 35c.

Each of the L-type hands 35a, 35b, and 35c forms a substantially L shape, as shown in FIG. 3. Note that FIG. 3 shows only the L-type hand 35a. The L-type hand 35a is provided of a hand bottom 35-1 and finger tips 35-2 and 35-3 provided at the two ends of the hand bottom 35-1.

One finger tip 35-3 is shorter than the other finger tip 35-2. More specifically, the finger tip 35-3 is formed short so it does not interfere with the plate-like hand 28 of the wafer transportation robot 23, as shown in FIG. 3, when the plate-like hand 28 is inserted in the second transfer direction from the rear side H of the macroinspection/transportation section 22.

The L-type hand 35a has a plurality of suction holes (with suction pads) 35-4 formed at predetermined intervals. The suction holes 35-4 communicate with a suction pump (not shown).

The remaining L-type hands 35b and 35c have the same arrangement as that of the L-type hand 35a, and a description thereof will be omitted.

The wafer transportation apparatus 32 rotates counterclockwise (the direction of arrow) on the sheet of drawing about the rotating shaft 33 as the center. Thus, the transportation arms 34a, 34b, and 34c are circularly transferred among a wafer transfer position $P_1$, macroinspection position $P_2$, and microinspection/transfer position $P_3$.

The central position of the wafer transfer position $P_1$ is at the same distance from a left wall surface $E_1$ and rear wall surface $E_2$ of the macroinspection/transportation section 22. The central position of the wafer transfer position $P_1$ suffices as far as the distances from the left wall surface $E_1$ and rear wall surface $E_2$ to the rotating shaft 27 of the wafer transportation robot 23 fall within the transportation stroke range of the wafer transportation robot 23.

The central position of the wafer transfer position $P_1$ can also be set at a point where the stretch/contraction directions of the connection arms 24 to 26 entering from the left wall surface $E_1$ and rear wall surface $E_2$ intersect.

As shown in FIG. 3, non-contact position sensors 36 to 39 for aligning the semiconductor wafer 3 are arranged at the wafer transfer position $P_1$.

The non-contact position sensors 36 to 39 are arranged at positions corresponding to the outer peripheral edges (to be referred to as the wafer edges hereinafter) of a plurality of semiconductor wafers 3 having different diameters, e.g., semiconductor wafers 3 having diameters of 200 mm and 300 mm.

The semiconductor wafer with the diameter of 200 mm will be referred to as a semiconductor wafer 3A, and the semiconductor wafer with the diameter of 300 mm will be referred to as a semiconductor wafer 3B.

The non-contact position sensors 36 to 39 detect the wafer edge of the semiconductor wafer 3A or 3B. The non-contact position sensors 36 to 39 are obtained by arraying a plurality of solid-state image sensing elements (CCDs) in a plurality of rows, e.g., in one row, and forming slits 36a to 39a in the front surfaces of the CCDs. The slits 36a to 39a are formed parallel to the array direction of the CCDs.

More specifically, the four non-contact position sensors 36 to 39 are arranged on one circle, at positions corresponding to the wafer edge position of the semiconductor wafer 3B with the diameter of 300 mm, about the wafer transfer position $P_1$ as the center.

The two non-contact position sensors 36 and 37 are combined to form one set, and other two non-contact position sensors 38 and 39 are combined to form the other set.

When the semiconductor wafer 3B with the diameter of 300 mm is positioned at the wafer transfer position $P_1$, the set of non-contact position sensors 36 and 37 and the set of non-contact position sensors 38 and 39 detect its wafer edge at four portions.

When the semiconductor wafer 3A with the diameter of 200 mm is positioned at the wafer transfer position $P_1$, it is reciprocally moved by the wafer transportation robot 23 between the non-contact position sensors 36 and 37 and the non-contact position sensors 38 and 39.

When the semiconductor wafer 3A moves to the upper right, one set of non-contact position sensors 36 and 37 detect its wafer edge at two portions.

When the semiconductor wafer 3A moves to the lower left, the other set of non-contact position sensors 38 and 39 detect its wafer edge at two portions.

At this time, the non-contact position sensors 36 to 39 for alignment are arranged such that they do not overlap the plate-like hand 28 with respect to the first transfer direction from the left side A corresponding to the first specification and the second transfer direction from the rear side H corresponding to the second specification.

A description will be made on the plate-like hand 28 again. As shown in FIG. 3, the relief 29 of the plate-like hand 28 is formed such that it does not interfere with the elongated finger tip 35-2 of the L-type hand 35a, 35b, or 35c when the plate-like hand 28 moves vertically to perform first transfer of the semiconductor wafer 3 with respect to the first transfer direction.

When the semiconductor wafer 3 is to be transferred, as shown in FIG. 3, the drawing portion 30 of the plate-like hand 28 enters the substantially L-shaped space of the L-type hand 35a. At this time, the finger tip 35-2 of the L-type hand 35a enters the relief 29 of the plate-like hand 28. The relief 29 avoids interference with the detection view fields of the four non-contact position sensors 36 to 39.

As shown in FIGS. 1 and 2, the drawing portion 30 of the plate-like hand 28 forms substantially a square so they will not interfere with the L-type hand 35a (35b, 35c) with respect to the first and second transfer directions.

Figure 4:
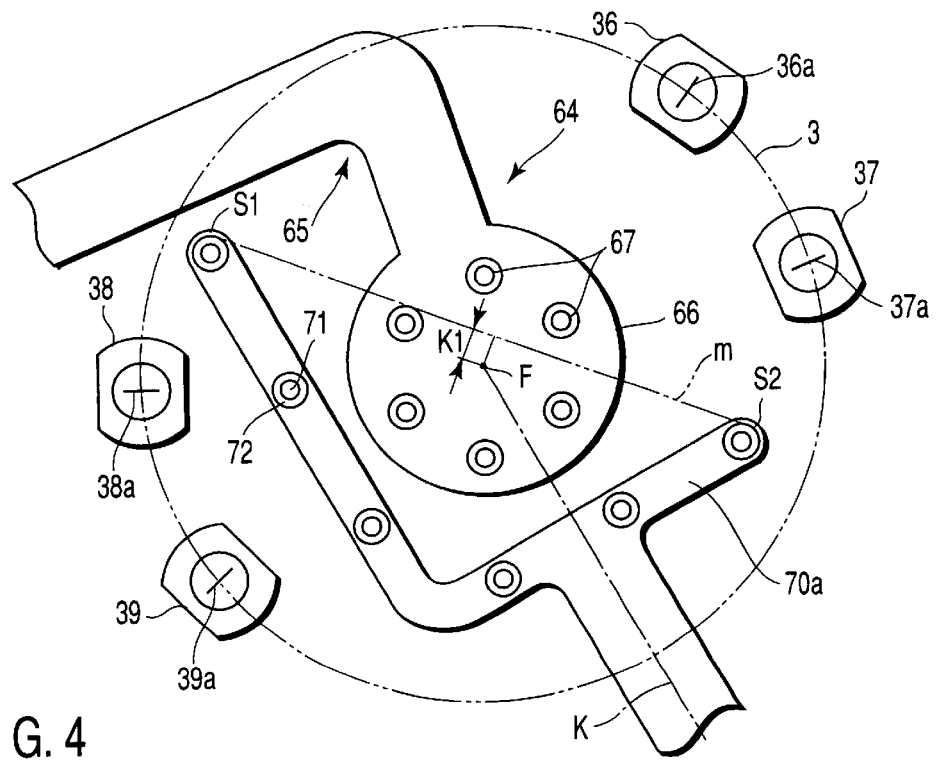
FIG. 4 is a view showing a modification of a circular hand and L-type hand in the substrate transportation apparatus according to the first embodiment of the present invention.

Other than a square shape, the drawing portion 30 may be a circular shape, as shown in FIG. 4.

The L-type hand 35a (35b, 35c) may have an L shape as shown in FIG. 4.

The positional relationship when the semiconductor wafer 3 is to be transferred between a circular hand 64 and L-type hand 70a will be described with reference to FIG. 4.

The circular hand 64 is formed of a relief 65 and drawing portion 66. The drawing portion 66 has a plurality of suction holes 67 with suction pads.

The L-type hand 70a has one finger. Suction pads are attached to suction holes 71.

FIG. 4 shows a state wherein the circular hand 64 is entered in the L-shaped space of the L-type hand 70a in an oblique direction. The oblique direction means that the circular hand 64 is to be entered with respect to an axial direction K of the L-type hand 70a.

In order to stabilize the transfer operation of the semiconductor wafer 3, the circular hand 64 and L-type hand 70a are arranged to satisfy the following positional relationship.

Assume that a line connecting distal ends $S_1$ and $S_2$ of the respective finger tips of the L-type hand 70a is defined as m. Also assume that when the semiconductor wafer 3 is drawn by suction and held on the drawing portion 66 of the circular hand 64, the wafer central position of the semiconductor wafer 3 is defined as F.

The circular hand 64 and L-type hand 70a are arranged such that the position of the wafer center F is on the inner side of the hand with respect to the line m.

A distance $K_1$ with which the wafer center F is on the inner side of the wafer with respect to the line m is preferably 6 mm or more with the semiconductor wafer 3 having a diameter of 200 mm, and is preferably 10 mm or more with the semiconductor wafer 3 having a diameter of 300 mm.

In this manner, the operation of arranging the semiconductor wafer 3 such that the position of its wafer center F is located inside the hand with respect to the line m of the L-type hand 70a is performed by, e.g., stretching, contracting, and rotating the respective connection arms 24 to 26 of the wafer transportation robot 23.

When the semiconductor wafer 3 is to be positioned at the wafer transfer position $P_1$ by the operation of the wafer transportation robot 23, the wafer center F of the semiconductor wafer 3 is aligned on the basis of the detection results of the four non-contact position sensors 36 to 39.

Through this alignment, the position of the wafer center F of the semiconductor wafer 3 is arranged on the inner side of the hand of the L-type hand 70a.

When the semiconductor wafer 3 is to be transferred between the circular hand 64 and L-type hand 70a in this manner, for example, the wafer center F of the semiconductor wafer 3 drawn by suction on the circular hand 64 is always located on the inner side of the line m that connects the distal ends $S_1$ and $S_2$ of the respective finger tips of the L-type hand 70a.

Therefore, the semiconductor wafer 3 does not wave or flap but can be transported and transferred stably between the circular hand 64 and L-type hand 70a.

In wafer transfer, the position of the wafer center F of the semiconductor wafer 3 is always positioned at the inner side of the hand by the distance $K_1$ with respect to the line m that connects the distal ends $S_1$ and $S_2$ of the respective finger tips of the L-type hand 22a. Therefore, the semiconductor wafer 3 can be stably drawn by suction and held on the L-type hand 70a.

Figure 5:
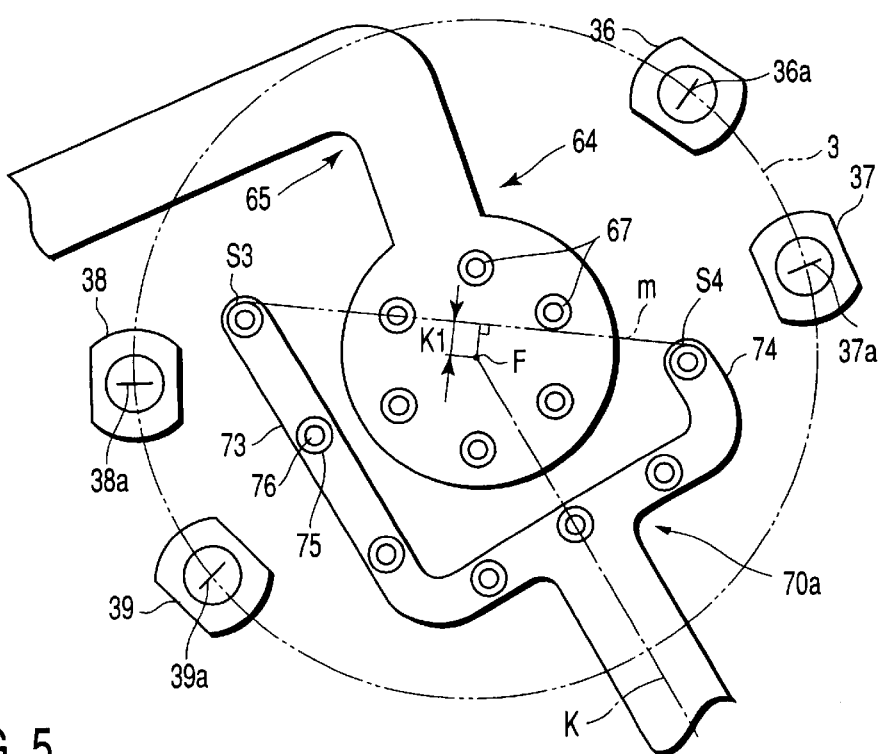
FIG. 5 is a view showing a modification of a circular hand and L-type hand in the substrate transportation apparatus according to the first embodiment of the present invention.

As shown in FIG. 5, an L-type hand 70a having finger tips 73 and 74 with different lengths may be used.

The finger tip 73 is longer than the finger tip 74. The finger tips 73 and 74 are parallel to each other. Each of the finger tips 73 and 74 has a plurality of suction holes 76 with pads 75.

A semiconductor wafer 3 is transferred by entering the circular hand 64 in the L-shaped space of the L-type hand 70a in an oblique direction.

At this time, distal ends $S_3$ and $S_4$ of the respective finger tips 73 and 74 of the L-type hand 70a are connected by a line m.

The circular hand 64 and L-type hand 70a are arranged in the following manner in order to stabilize the transfer operation of the semiconductor wafer 3.

The L-type hand 70a is arranged such that the position of the wafer center F of the semiconductor wafer 3 drawn by suction on the circular hand 17 is on the inner side of the hand with respect to the line m.

At this time, the wafer center F is arranged on the inner side of the wafer by a distance $K_1$ from the line m.

Figure 6:
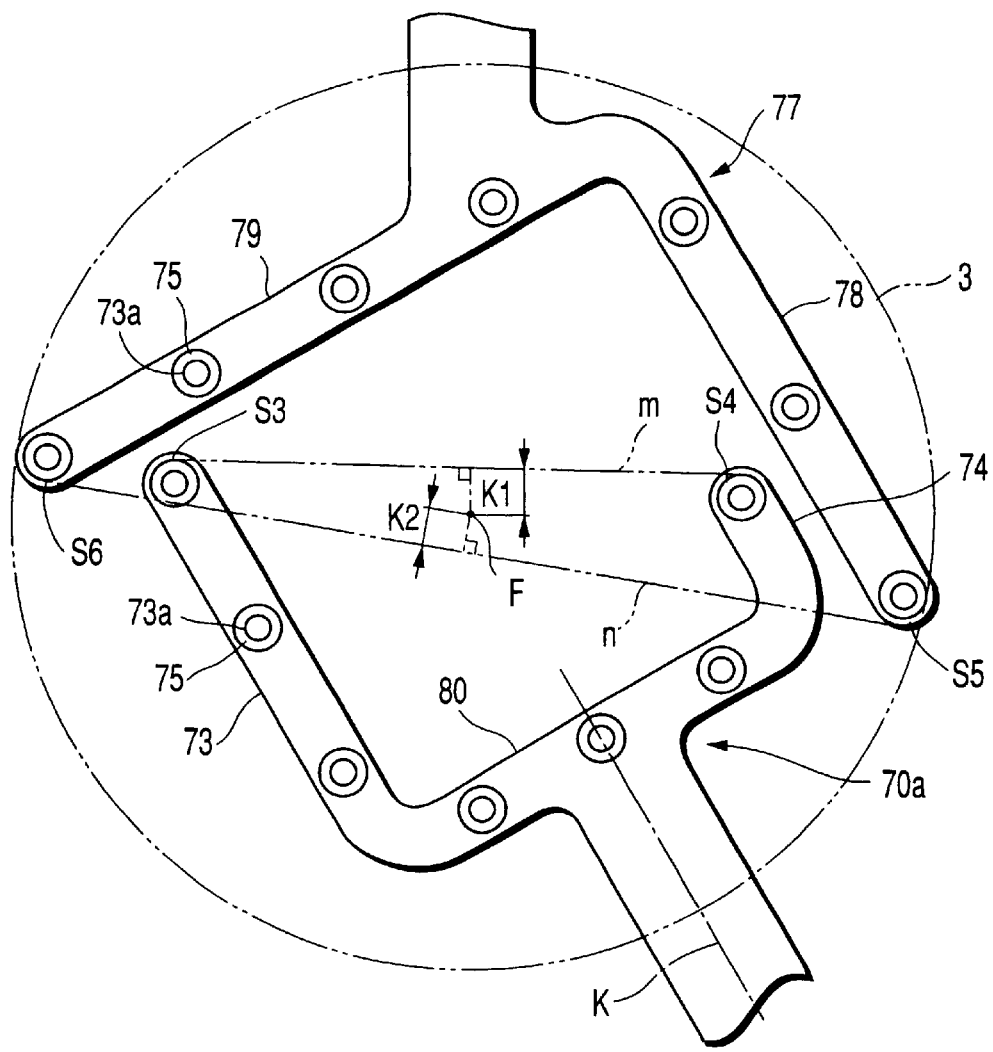
FIG. 6 is a view showing a modification of an L-type hand and L-type hand in the substrate transportation apparatus according to the first embodiment of the present invention.

FIG. 6 shows another combination of hands. The hand of a wafer transportation robot 23 is an L-type hand 77. The hand of a wafer transportation apparatus 68 is an L-type hand 70a having finger tips 73 and 74 with different lengths.

The L-type hand 77 has two finger tips 78 and 79 perpendicular to each other. The L-type hand 77 is entered in the oblique direction with respect to an axial direction K of the L-type hand 70a.

At this time, the L-type hand 77 is arranged such that its one finger tip 78 is parallel to the finger tip 74 of the L-type hand 70a and that its other finger tip 79 is parallel to a bottom 80 of the L-type hand 70a.

A semiconductor wafer 3 is transferred by entering the L-type hand 77 in the L-type hand 70a in an oblique direction.

The L-type hand 77 and L-type hand 70a are arranged in the following manner in order to stabilize the transfer operation of the semiconductor wafer 3.

Assume a line m that connects distal ends $S_3$ and $S_4$ of the respective finger tips 73 and 74 of the L-type hand 70a.

The semiconductor wafer 3 is drawn by suction and held on the L-type hand 77. The position of a wafer center F of the semiconductor wafer 3 is arranged on the inner side of the L-type hand 70a by a distance $K_1$ from the line m.

Also assume a line n that connects distal ends $S_5$ and $S_6$ of the respective finger tips 78 and 79 of the L-type hand 77.

The position of the wafer center F of the semiconductor wafer 3 is arranged on the inner side of the L-type hand 77 by a distance $K_2$ from the line n.

The distances $K_1$ and $K_2$ are preferably 6 mm or more with the semiconductor wafer 3 having a diameter of 200 mm, and 10 mm or more with the semiconductor wafer 3 having a diameter of 300 mm.

A macroinspection swing mechanism 40 is provided at the macroinspection position $P_2$. The macroinspection swing mechanism 40 swings while the semiconductor wafer 3 is held, so the upper and lower surfaces of the semiconductor wafer 3 are macroinspected by the inspector through visual observation.

A macroinspection illumination unit 53 (FIG. 8) for illuminating the surface of the semiconductor wafer 3 is arranged above the macroinspection position $P_2$.

A monitor 41 is provided in the vicinity of a viewing range θ with which an inspector Q observes the semiconductor wafer 3 on the macroinspection swing mechanism 40, at such a position that it does not interfere with macroinspection.

The monitor 41 displays an enlarged image of the semiconductor wafer 3 sensed by an image sensing unit 47, inspection results of macroinspection and microinspection, a screen for inputting the inspection results, data concerning the operations of a plurality of inspection apparatus units 42-1 to 42-n (to be described later), and the like.

For example, the monitor 41 is a CRT display or liquid crystal display.

In this embodiment, the monitor 41 is provided on the left side of the viewing range θ for macroinspection of the inspector Q. Hence, for example, eyepieces 48 of the inspection apparatus unit 42-1 and the monitor 41 are arranged close to each other on the right and left of the macroinspection swing mechanism 40, which performs observation frequently, as the center.

The height of the monitor 41 is substantially the same as that of the eyepieces 48, that is, the same as the eye level of the inspector Q when the inspector Q is in front of an operating section 45 of the inspection apparatus unit 42-1.

Of the plurality of inspection apparatus units 42-1 to 42-n, the inspection apparatus units 42-1 to 42-n that match the inspection items are incorporated in a right wall surface $E_3$ of the macroinspection/transportation section 22.

The inspection units 42-1 to 42-n are units for various types of inspection, e.g., the inspection unit 42-1 for microinspection of the semiconductor wafer 3, the inspection unit 42-n for thickness measurement of the semiconductor wafer 3, and the like.

The inspection unit 42-1 for microinspection has a microinspection section 44 and the operating section 45 on its frame 43.

The microinspection section 44 receives the semiconductor wafer 3 held by the hand 34a, 34b, or 34c positioned at the microinspection/transfer position $P_3$. The semiconductor wafer 3 is microinspected by using a microscope 46.

The microinspection section 44 has a substrate drawing portion 44a. The substrate drawing portion 44a is provided on a microinspection X-Y stage 44b of the microinspection section 44.

The substrate drawing portion 44a draws by suction and holds the semiconductor wafer 3 received from the L-type hand 35a, 35b, or 35c, and sets it in the microinspection section 44.

The substrate drawing portion 44a can be moved among the position of the L-type hand 35a, 35b, or 35c which is to be positioned at the microinspection/transfer position $P_3$.

At the microinspection section 44, the image of the semiconductor wafer 3 enlarged by the microscope 46 can be sensed by the image sensing unit 47 such as a CCD camera, or can be observed through the eyepieces 48.

At the operating section 45, operations of macroinspection, microinspection, inputting the inspection results, and inputting various types of data such as data concerning the operation of the outer appearance inspection apparatus as a whole are performed.

The thickness measurement inspection unit 42-n has a thickness measurement section 50 and operating section 51 on its frame 49.

The thickness measurement section 50 measures the thickness of a thin film formed on the surface of the semiconductor wafer 3. The thickness measurement section 50 has an observation window 52 at its front side.

At the operating section 51, operations of macroinspection, thickness measurement, inputting the results of the macroinspection and thickness measurement, and inputting various types of data such as data concerning the operation of the outer appearance inspection apparatus as a whole are performed.

The operation of the apparatus with the above arrangement will be described.

First, a case wherein the inspection unit 42-1 is incorporated with an apparatus layout of the first specification will be described with reference to FIG. 7.

Figure 8:
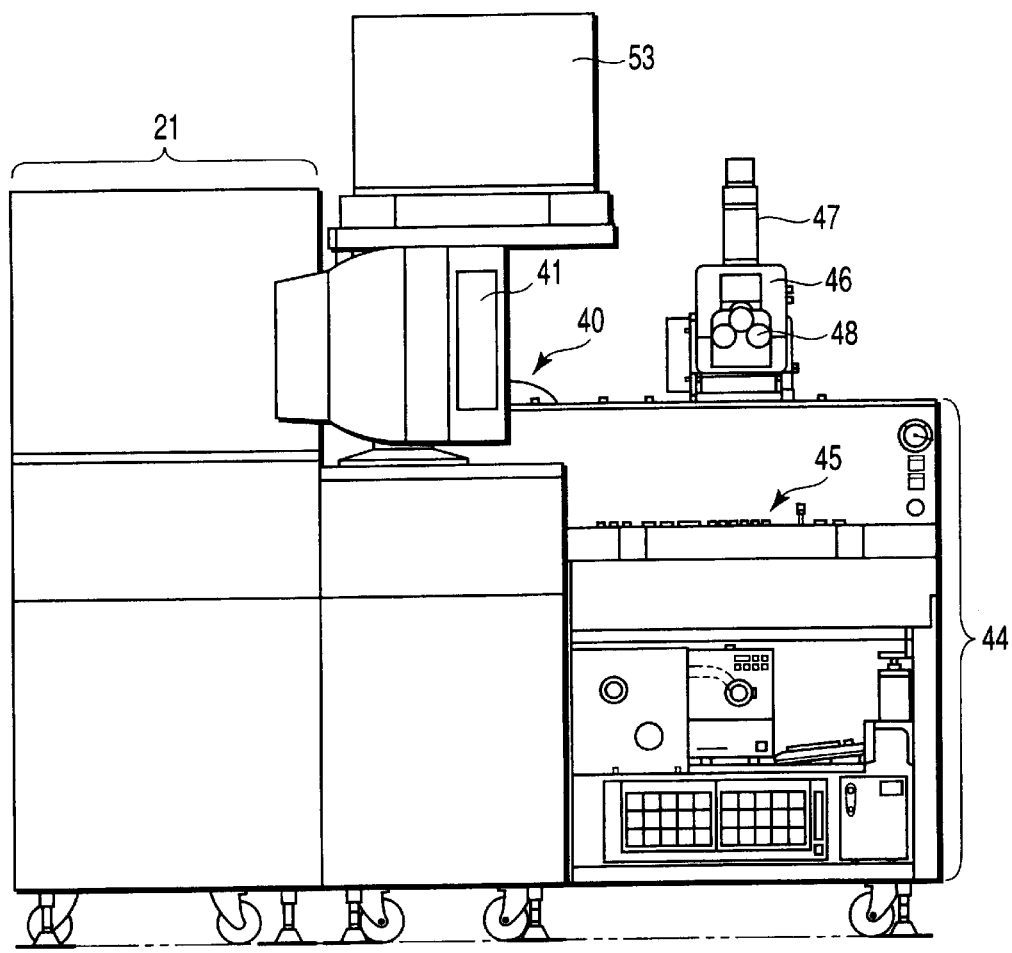
FIG. 8 is a front view showing the overall arrangement of the outer appearance inspection apparatus of the first specification which uses the substrate transportation apparatus according to the first embodiment of the present invention.

FIG. 8 is a front view of the apparatus with the first specification. The macroinspection illumination unit 53 is provided above the macroinspection swing mechanism 40.

For example, the hand 34a of the wafer transportation apparatus 32 is positioned at the wafer transfer position $P_1$. The hand 34b is positioned at the macroinspection position $P_2$. The L-type hand 35c is positioned at the microinspection/transfer position $P_3$.

At the wafer transfer position $P_1$, the wafer transportation robot 23 rotates around the rotating shaft 27 as the center and directs its arm to where the uninspected wafer carrier 1a is set.

Then, the wafer transportation robot 23 stretches the connection arms 24 to 26 and draws by suction and holds an uninspected semiconductor wafer 3a stored in the wafer carrier 1a.

The wafer transportation robot 23 then contracts the respective connection arms 24 to 26 and plate-like hand 28, rotates, e.g., counterclockwise through 90°, and is stopped to direct its arm toward the wafer transfer position $P_1$ of the macroinspection/transportation section 22.

The wafer transportation robot 23 then stretches the respective connection arms 14 to 16 and plate-like hand 28 again in the direction of an arrow A. The wafer transportation robot 23 inserts the plate-like hand 28 in the macroinspection/transportation section 22 from the left wall surface $E_1$, and stops it on the wafer transfer position $P_1$.

At this time, the plate-like hand 28 of the wafer transportation robot 23 is positioned in the L-shaped opening of the L-type hand 35a of the wafer transportation apparatus 32, as shown in FIG. 3.

Assume that a semiconductor wafer 3B with a diameter of, e.g., 300 mm, is positioned at the wafer transfer position $P_1$. At this time, the non-contact position sensors 36 and 37 and non-contact position sensors 38 and 39 detect the wafer edges of this semiconductor wafer 3B at four portions.

Assume that a semiconductor wafer 3A with a diameter of 200 mm is positioned at the wafer transfer position $P_1$. At this time, the wafer transportation robot 23 reciprocally moves the semiconductor wafer 3A toward the two sets of non-contact position sensors, so the non-contact position sensors 36 and 37 and the non-contact position sensors 38 and 39 detect the wafer edges of the semiconductor wafer 3A at four portions.

The wafer central position of the semiconductor wafer 3B or 3A is calculated from the three edge positions, of the edge position signals of these four portions, which do not overlap an orientation flat or notch in accordance with a known equation of circle.

The wafer transportation robot 23 is controlled on the basis of this calculation result so the wafer center of the semiconductor wafer 3B or 3A coincides with the central position of the wafer transfer position $P_1$, and the semiconductor wafer 3B or 3A is aligned.

The wafer transportation robot 23 then releases the semiconductor wafer 3a and transfers the semiconductor wafer 3a on the plate-like hand 28 to the L-type hand 35a.

More specifically, the wafer transportation robot 23 arranges the plate-like hand 28, which holds the semiconductor wafer 3a, above the hand 34a, and then moves it down to transfer the aligned semiconductor wafer 3a to the L-type hand 35a.

At this time, the plate-like hand 28 of the wafer transportation robot 23 enters the substantially L shape of the L-type hand 35a of the wafer transportation apparatus 32, as shown in FIG. 3, while the longer-side finger tip 35-2 of the L-type hand 35a enters the relief 29.

At the macroinspection position $P_2$, the semiconductor wafer 3 drawn by suction and held by the L-type hand 35b is transferred to the macroinspection swing mechanism 40.

At this time, the L-type hand 35b releases the semiconductor wafer 3.

The macroinspection swing mechanism 40 moves, e.g., from under the L-type hand 35b upward, and receives the semiconductor wafer 3 held by the L-type hand 35b.

The macroinspection swing mechanism 40 swings while holding the semiconductor wafer 3. The semiconductor wafer 3 is irradiated with illumination light from the macroinspection illumination unit 53 at a predetermined incident angle.

The inspector Q performs macroinspection by visually observing, e.g., scattered light from the surface of the swinging semiconductor wafer 3.

When macroinspection is ended, the macroinspection swing mechanism 40 transfers the semiconductor wafer 3 to the L-type hand 35b. At this time, the macroinspection swing mechanism 40 moves from, e.g., above the L-type hand 35b downward, and transfers the semiconductor wafer 3 to the L-type hand 35b.

At the microinspection/transfer position $P_3$, the microinspection inspection unit 42-1 receives the semiconductor wafer 3 held on the L-type hand 35c, places it on the substrate drawing portion 44a, and aligns it highly precisely with an aligner.

The substrate drawing portion 44a draws by suction and holds the semiconductor wafer 3 received from the L-type hand 35c, and sets it in the microinspection section 44.

The microinspection section 44 moves the microscope 46 in the X and Y directions to scan the entire surface of the semiconductor wafer 3. Thus, the semiconductor wafer 3 is enlarged by the objective lens of the microscope 46, and its enlarged image is sensed by the CCD camera or the like.

At the same time, the enlarged image of the semiconductor wafer 3 is observed by the inspector Q through the eyepieces 48. The inspector Q observes the enlarged image of the semiconductor wafer 3 through the eyepieces 48, thereby performing microinspection.

When microinspection is ended, the inspection unit 42-1 unloads the inspected semiconductor wafer 3b from it, and transfers it onto the L-type hand 35c.

During macroinspection and microinspection, the inspector Q slightly looks away to the left from the front surface of the macroinspection/transportation section 22, to observe the semiconductor wafer 3 placed on the macroinspection swing mechanism 40. Macroinspection is thus performed.

At the same time, the inspector Q observes the A enlarged image of the semiconductor wafer 3 displayed on the monitor 41 by merely slightly looking away to the left from the macroinspection swing mechanism 40. Microinspection is thus performed.

During macroinspection, defective data and a defective image extracted in the previous step are displayed on the monitor 41. A defect that needs attention and extracted in the previous step can be recognized easily, and a new defect occurring in the present step can be discovered easily.

When the inspector Q wishes to actually observe the enlarged image of the semiconductor wafer 3, he looks at the front. Thus, the inspector Q can perform microobservation through the eyepieces 48.

When macroinspection and microinspection are ended, the wafer transportation apparatus 32 rotates again, e.g., counterclockwise, on the sheet of drawing about the rotating shaft 33 as the center.

Hence, the L-type hands 35a, 35b, and 35c of the wafer transportation apparatus 32 are positioned at the macroinspection position $P_2$, microinspection/transfer position $P_3$, and wafer transfer position $P_1$, respectively.

While macroinspection and microinspection take place at the wafer transfer position $P_1$, the inspected semiconductor wafer 3b is returned to the wafer carrier 1a by the wafer transportation robot 23, and the uninspected semiconductor wafer 3a is extracted from the wafer carrier 1a and positioned at the wafer transfer position $P_1$ in the same manner as that described above.

After this, the wafer transportation apparatus 32 rotates the three transportation arms 34a, 34b, and 34c through the same angle (e.g., 120°) successively.

The three transportation arms 34a, 34b, and 34c circularly shift among the wafer transfer position $P_1$, macroinspection position $P_2$, and microinspection/transfer position $P_3$.

At the wafer transfer position $P_1$, the uninspected and inspected semiconductor wafers 3a and 3b are transferred.

At the macroinspection position $P_2$, the semiconductor wafer 3 is macroinspected.

At the microinspection/transfer position $P_3$, the semiconductor wafer 3 is macroinspected.

A case wherein the inspection unit 42-1 is incorporated with an apparatus layout of the second specification will be described with reference to FIG. 9.

In an arrangement corresponding to the second specification, the semiconductor wafer 3 is transferred by the loader 21 with respect to the macroinspection/transportation section 22 from the rear side H direction of the macroinspection/transportation section 22.

The operations of macroinspection and microinspection at the macroinspection/transportation section 22 are the same as in the case of the first specification described above, and a detailed description thereof will accordingly be omitted.

Figure 7:
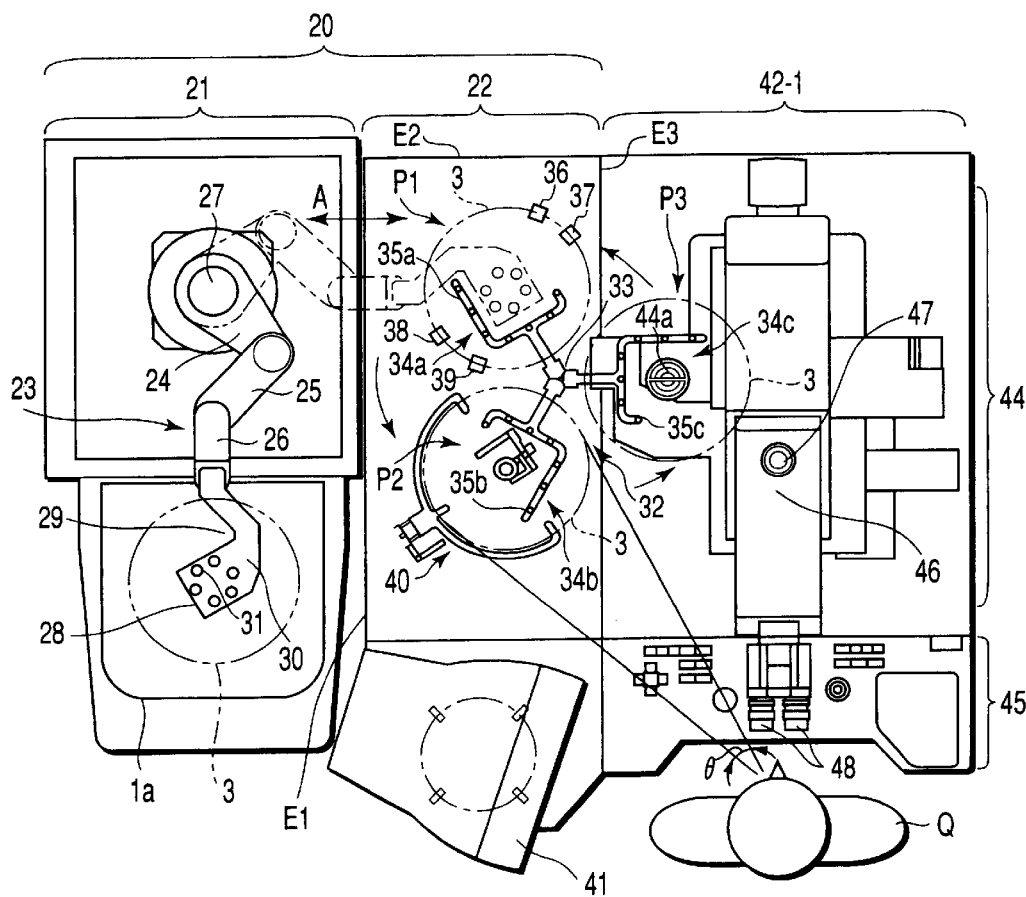
FIG. 7 is a view showing the overall arrangement of the outer appearance inspection apparatus of the first specification which uses the substrate transportation apparatus according to the first embodiment of the present invention.

The semiconductor wafer 3 is transferred between the loader 21 and macroinspection/transportation section 22 in a direction (the direction of the arrow H) which is different from the transfer direction (the direction of the arrow A) of the first specification shown in FIG. 7 by substantially 90°.

The wafer carrier 1a is integrally formed on the left side of the loader 21.

Alternatively, the wafer carrier 1a may be formed on the right side of the loader 21, or may be arranged by rotating through 180° around the rotating shaft 27 of the wafer transportation robot 23 as the center.

A difference in transfer of the semiconductor wafer 3 between the loader 21 and macroinspection/transportation section 22 from the apparatus of the first specification shown in FIG. 7 will be described.

At the wafer transfer position $P_1$, the wafer transportation robot 23 extracts the uninspected semiconductor wafer 3a from the wafer carrier 1a, and stretches the respective connection arms 24 to 26 and plate-like hand 28 in the direction of the arrow H. The plate-like hand 28 is inserted in the macroinspection/transportation section 22 from the rear wall surface $E_2$, and is stopped on the wafer transfer position $P_1$.

At this time, the plate-like hand 28 of the wafer transportation robot 23 is located in the L-shaped opening of the L-type hand 35a of the wafer transportation apparatus 32.

In the first and second specifications described with reference to FIGS. 7 and 9, the cases wherein the microinspection inspection unit 42-1 is incorporated are described.

According to the first embodiment, in place of the microinspection unit incorporating an optical microscope, a microobservation inspection unit such as an AFM (Atomic Force Microscope) or LSM (laser scanning microscope), or an inspection unit for thickness measurement or line width measurement can be incorporated.

For example, assume that the inspection unit 42-n for thickness measurement shown in FIGS. 1 and 2 is incorporated. At the microinspection/transfer position (in this case, a thickness measurement position) $P_3$, the thickness of a thin film formed on the surface of the semiconductor wafer 3 is to be measured.

Through the operating section 51, the inspector Q performs operations for macroinspection and thickness measurement, and of inputting the results of macroinspection and thickness measurement and inputting various types of data such as data concerning the operation of the entire outer appearance inspection apparatus.

More specifically, the inspector Q slightly looks away to the left from the front surface of the thickness measurement inspection unit 42-n, and observes the semiconductor wafer 3a on the macroinspection swing mechanism 40. Thus, macroinspection is performed.

The inspector Q can slightly look away to the left from the direction of observing the macroinspection swing mechanism 40, and can observe the semiconductor wafer 3a during thickness measurement from the image displayed on the monitor 41.

The inspector Q can observe the actual semiconductor wafer 3a through the observation window 52. Since shift of glance during inspection is reduced, the cumbersomeness of observation can be reduced.

The inspector Q inputs the inspection results of macroinspection and thickness measurement from the operating section 45 or 51. Since the moving range of the glance can be reduced, the cumbersomeness of observation can be reduced.

In this manner, according to the first embodiment described above, in the substrate transportation apparatus 20, the loader 21 and macroinspection/transportation section 22 are separated to be independent of each other. Also, the central position of the wafer transfer position $P_1$ of the macroinspection/transportation section 22 is set within the transportation stroke range of the wafer transportation robot 23 with respect to the left wall surface $E_1$ and rear wall surface $E_2$.

With this arrangement, the loader 21 can be easily arranged in two transfer directions corresponding to the first and second specifications with respect to the macroinspection/transportation section 22.

Preferably, the central position of the wafer transfer position $P_1$ is set at the same distance from the left wall surface $E_1$ and rear wall surface $E_2$ of the macroinspection/transportation section 22. Then, the arrangement and position can be changed without changing the design of the loader 21.

Therefore, the apparatus layout can be easily adapted to the first or second specification when, e.g., the transportation path in the facilities is on the left side or rear side of the outer appearance inspection apparatus, or in accordance with the shape of a space in the facilities where the outer appearance inspection apparatus is to be installed.

Even when the specification of the apparatus layout in the inspection process at the semiconductor manufacturing factory is changed in design to either the first or second specification described above, the direction in which the semiconductor wafer 3 is to be supplied or discharged with respect to the macroinspection/transportation section 22 can be easily changed from the left side or rear side of the macroinspection/transportation section 22.

When the apparatus layout is changed to the first or second specification, many constituent components are common, and changing the specification does not take time or cumbersome operation.

The first or second specification can be coped with by minimum design changes, so the apparatus can have a high versatility.

Various types of microobservation inspection units or various types of measurement inspection units can be incorporated easily in accordance with inspections items for the semiconductor wafer 3.

The plate-like hand 28 of the wafer transportation robot 23 integrally has the V-shaped relief 29 and the drawing portion 30 with the plurality of suction holes 31 for drawing the semiconductor wafer 3 by suction.

The relief 29 is formed to avoid interference with the alignment non-contact position sensors 36 to 39 arranged at the wafer transfer position $P_1$ for the semiconductor wafer 3 in the macroinspection/transportation section 22.

Each of the L-type hands 35a, 35b, and 35c of the wafer transportation apparatus 32 has a substantially L shape with one long finger tip 35-2 and the other short finger tip 35-3.

Therefore, the plate-like hand 28 of the wafer transportation robot 23 can enter the L-type hand 35a, 35b, or 35c of the wafer transportation apparatus 32 in two directions, and can transfer the semiconductor wafer 3 in a manner corresponding to the first and second specifications.

When the semiconductor wafer 3 is to be transferred, its central position is aligned. During alignment, the detection operation of the four non-contact position sensors 36 to 39 for alignment is not interfered with.

The monitor 41 for both macroinspection and microinspection is provided in the vicinity of the viewing range θ with which the inspector Q observes the semiconductor wafer 3 on the macroinspection swing mechanism 40. The eyepieces 48 of the inspection unit 42-1 for microinspection and the monitor 41 are arranged close to each other with respect to the macroinspection swing mechanism 40, which performs observation frequently, as the center.

Hence, the inspector Q can slightly look away to the left from the front surface of the operating section 45 and observe the semiconductor wafer 3 on the macroinspection swing mechanism 40, thereby performing macroinspection.

The inspector Q can then slightly look away to the left and input various types of information while seeing the macroinspection result on the monitor 41.

At the same time, during microinspection, the inspector Q observes the enlarged image of the semiconductor wafer 3 displayed on the monitor 41. Microinspection can thus be performed.

Furthermore, the inspector Q can observe the enlarged image of the actual semiconductor wafer 3 through the eyepieces 48. Thus, when detailed microobservation is to be performed with much time, the inspector Q merely need to look at the front surface. Hence, the inspector Q can reduce shift of glance during inspection, so the cumbersomeness of observation can be reduced.

The second embodiment of the present invention will be described with reference to the accompanying drawings. The same portions as in FIG. 7 are denoted by the same reference numerals, and a detailed description thereof will be omitted.

Figure 10:
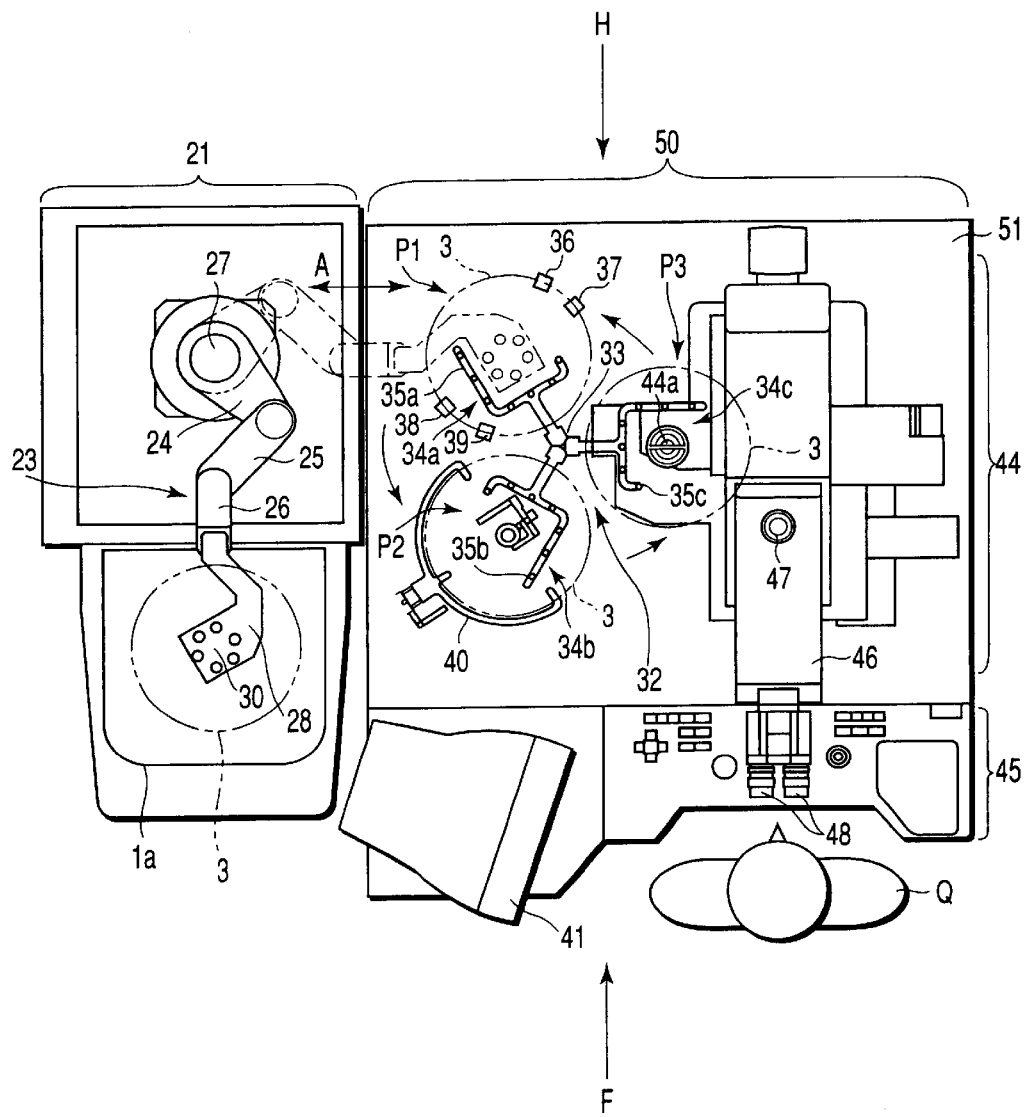
FIG. 10 is a view showing the overall arrangement of an outer appearance inspection apparatus of the third specification which uses a substrate transportation apparatus according to the second embodiment of the present invention.

FIG. 10 is a view showing the overall arrangement of an outer appearance inspection apparatus provided to an inspection process at a semiconductor manufacturing factory.

In the outer appearance inspection apparatus, a macroinspection/transportation section 22 and an inspection unit 42-1 for microinspection which are identical to those shown in FIG. 7 are integrated.

In an inspecting section 50, the macroinspection/transportation section 22 and inspection unit 42-1 for microinspection are formed on an inspecting section frame 51.

Accordingly, a loader 21 and the inspecting section 50 are separate and independent of each other.

The loader 21 can be arranged in two transfer directions with respect to the inspecting section 50. With the first transfer direction, a semiconductor wafer 3 is transferred with respect to the inspecting section 50 from the left when seen from a front side F, as shown in FIG. 10.

This apparatus layout corresponds to the third specification. According to the third specification, a transfer place for the semiconductor wafer 3 is on the left side. One wafer carrier 1a is provided. Also, and the macroinspection/transportation section 22 and inspection unit 42-1 are integrated.

Figure 11:
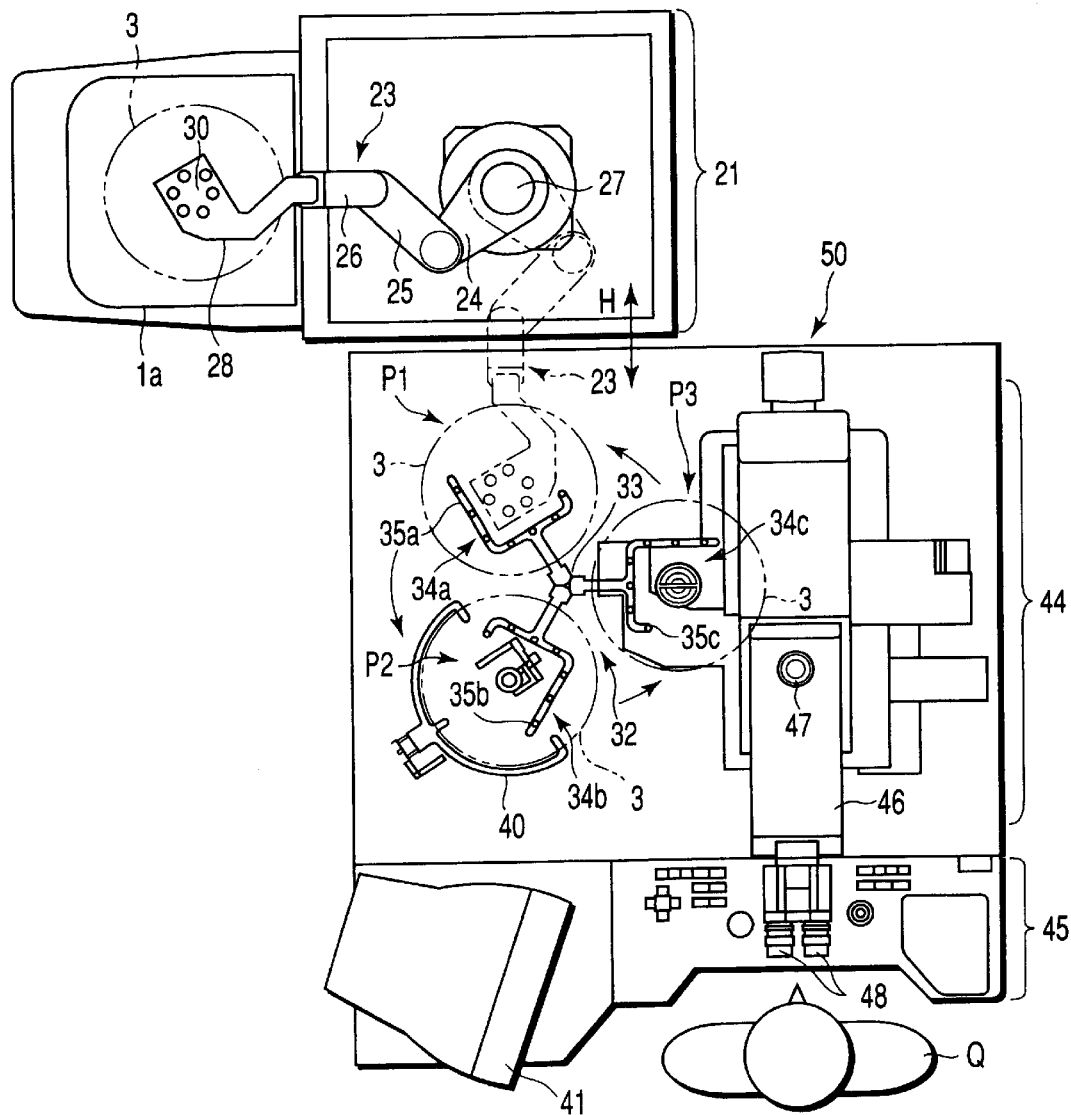
FIG. 11 is a view showing the overall arrangement of an outer appearance inspection apparatus of the fourth specification which uses the substrate transportation apparatus according to the second embodiment of the present invention.

With the second transfer direction, the semiconductor wafer 3 is transferred to the inspecting section 50 from a rear side H, as shown in FIG. 11. In this case, the loader 21 is arranged on the rear side H of the inspecting section.

This apparatus layout corresponds to the fourth specification. According to the fourth specification, the loader 21 is arranged on the rear side H of the inspecting section 50. One wafer carrier 1a is provided. Also, the macroinspection/transportation section 22 and inspection unit 42-1 are integrated.

In the inspecting section 50, if the macroinspection/transportation section 22 and inspection unit 42-1 are integrated, the positional relationship between them is the same as that of the first embodiment described above.

The central position of a wafer transfer position $P_1$ is at the same distance from a left wall surface $E_1$ and rear wall surface $E_2$ of the inspecting section 50. In addition, the central position of the wafer transfer position $P_1$ is set such that the distance from it to a rotating shaft 27 of a wafer transportation robot 23 is within the transportation stroke range of the wafer transportation robot 23.

Figure 9:
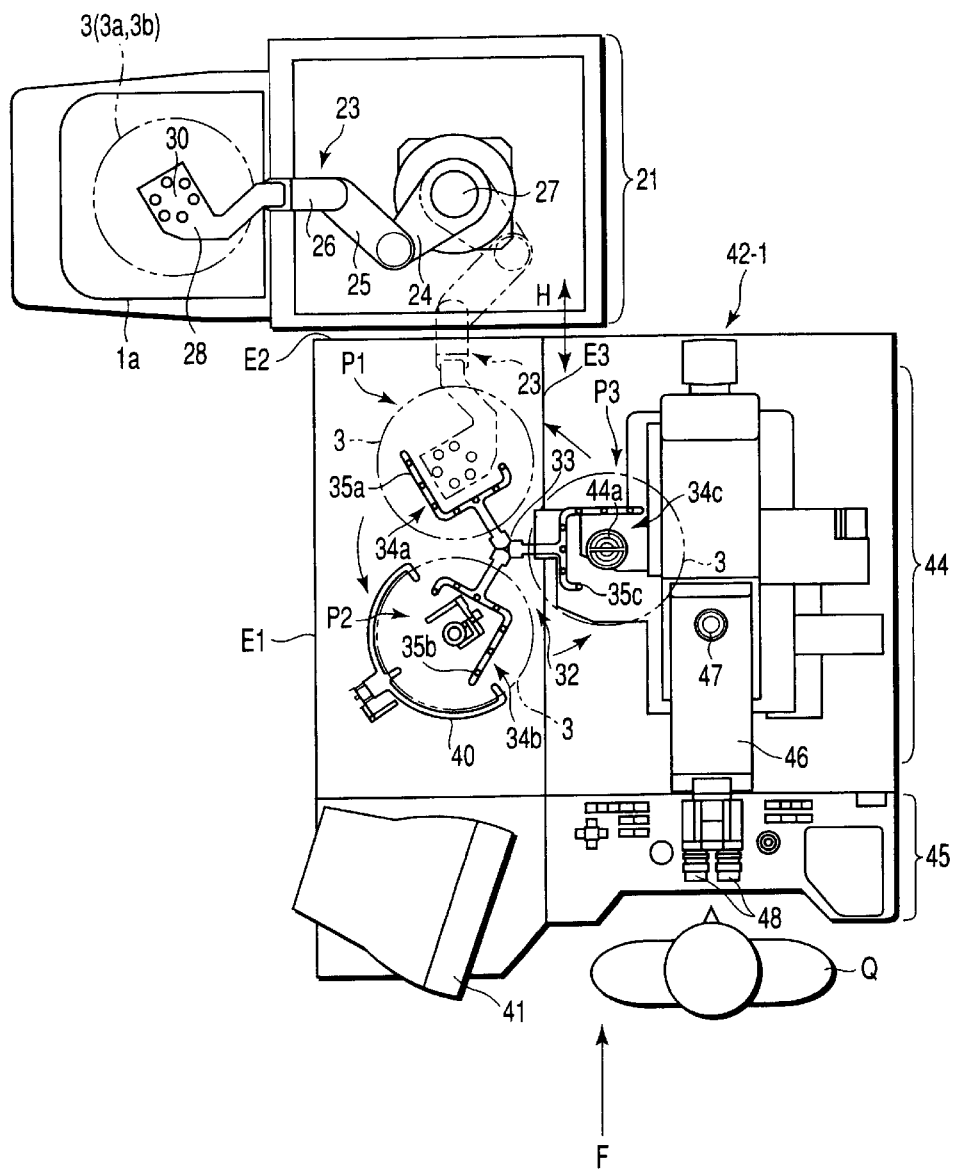
FIG. 9 is a view showing the overall arrangement of an outer appearance inspection apparatus of the second specification which uses the substrate transportation apparatus according to the first embodiment of the present invention.

The operation of the apparatus with the above arrangement is the same as those of the apparatuses shown in FIGS. 7 and 9, and a detailed apparatus thereof will be omitted to avoid repetition.

In this manner, according to the second embodiment described above, the loader 21 and inspecting section 50 are separate and independent of each other. The loader 21 can be arranged in two transfer directions corresponding to the third and fourth specifications with respect to the inspecting section 50.

Therefore, the apparatus layout can be easily adapted to the third or fourth specification when, e.g., the transportation path in the facilities is on the left side or rear side of the outer appearance inspection apparatus, or in accordance with the shape of a space in the facilities where the outer appearance inspection apparatus is to be installed.

In the inspecting section 50, the macroinspection/transportation section 22 and inspection unit 42-1 for microinspection are integrated. Therefore, aligning adjustment which is necessary when incorporating the inspection unit 42-1 in the macroinspection/transportation section 22 need not be performed.

According to the second embodiment described above, the same effect as that of the first embodiment can be obtained.

The third embodiment of the present invention will be described with reference to the accompanying drawing. In the drawing, the same portions as those of FIG. 10 are denoted by the same reference numerals, and a detailed description thereof will be omitted.

Figure 12:
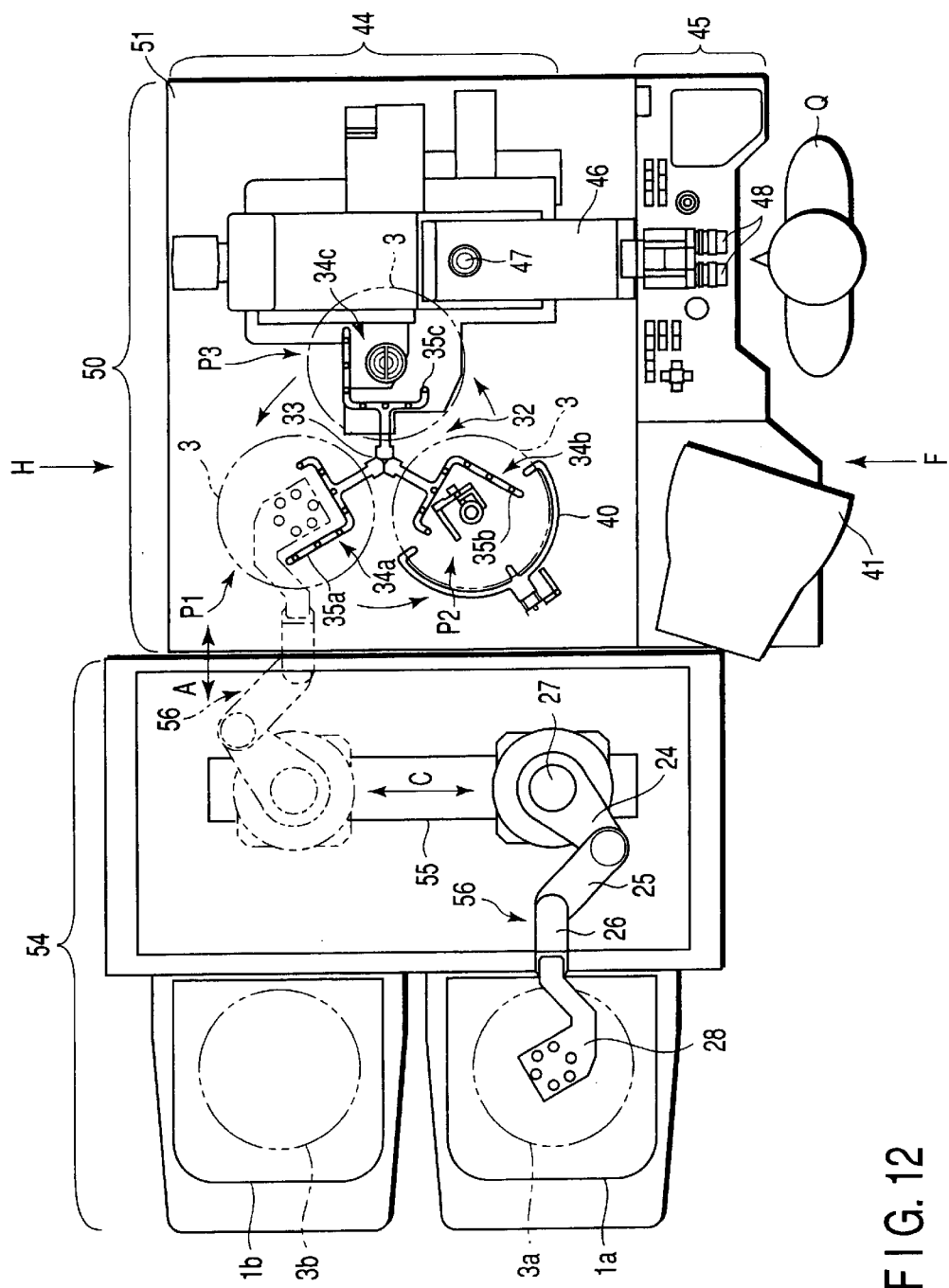
FIG. 12 is a view showing the overall arrangement of an outer appearance inspection apparatus of the fifth specification which uses a substrate transportation apparatus according to the third embodiment of the present invention.

FIG. 12 is a view showing the overall arrangement of an outer appearance inspection apparatus provided to an inspection process at a semiconductor manufacturing factory. An inspecting section 50 according to the third embodiment is identical to that of FIG. 10, except that a loader 54 has a different structure.

The outer appearance inspection apparatus corresponds to the fifth specification. According to the fifth specification, which a semiconductor wafer 3 is transferred to the inspecting section 50 from the left side. Also, two wafer carriers 1a and 1b are provided.

The loader 54 is arranged on the left side when seen from a front side F of the inspecting section 50. The loader 54 has a shift mechanism 55. A wafer transportation robot 56 is formed on the shift mechanism 55.

The shift mechanism 55 moves the wafer transportation robot 56 in a direction (direction of arrow C) to reciprocate between the front side F and a rear side H of the inspecting section 50.

The wafer transportation robot 56 supplies/discharges the semiconductor wafer 3 with respect to the inspecting section 50 from/to the left side (direction of arrow A) of the inspecting section 50.

The wafer transportation robot 56 has the same arrangement as that of the wafer transportation robot 23 used in the first and second embodiments. More specifically, the wafer transportation robot 56 is of an articulated type in which three connection arms 24 to 26 are connected to form an arm.

The loader 54 has the two wafer carriers 1a and 1b. The wafer carriers 1a and 1b are placed on the left side of the loader 54.

The wafer carrier 1a stores an uninspected semiconductor wafer 3a. The wafer carrier 1b stores an inspected semiconductor wafer 3b.

According to an apparatus layout corresponding to the fifth specification, the semiconductor wafer 3 is transferred to the inspecting section 50 by the loader 54 from the left side (direction of arrow A) of the inspecting section 50.

Figure 13:
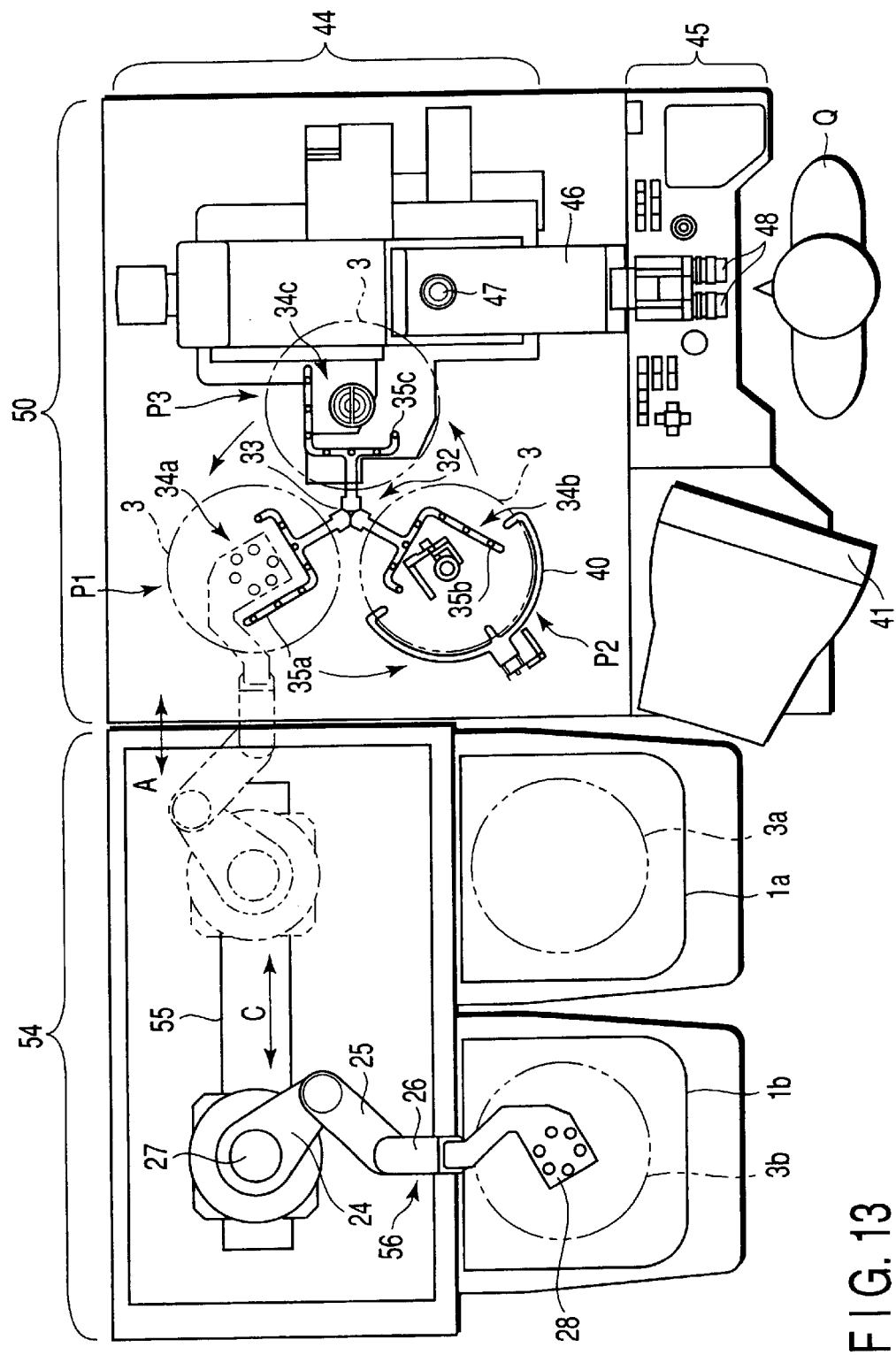
FIG. 13 is a view showing the overall arrangement of an outer appearance inspection apparatus of the sixth specification which uses the substrate transportation apparatus according to the third embodiment of the present invention.
Figure 14:
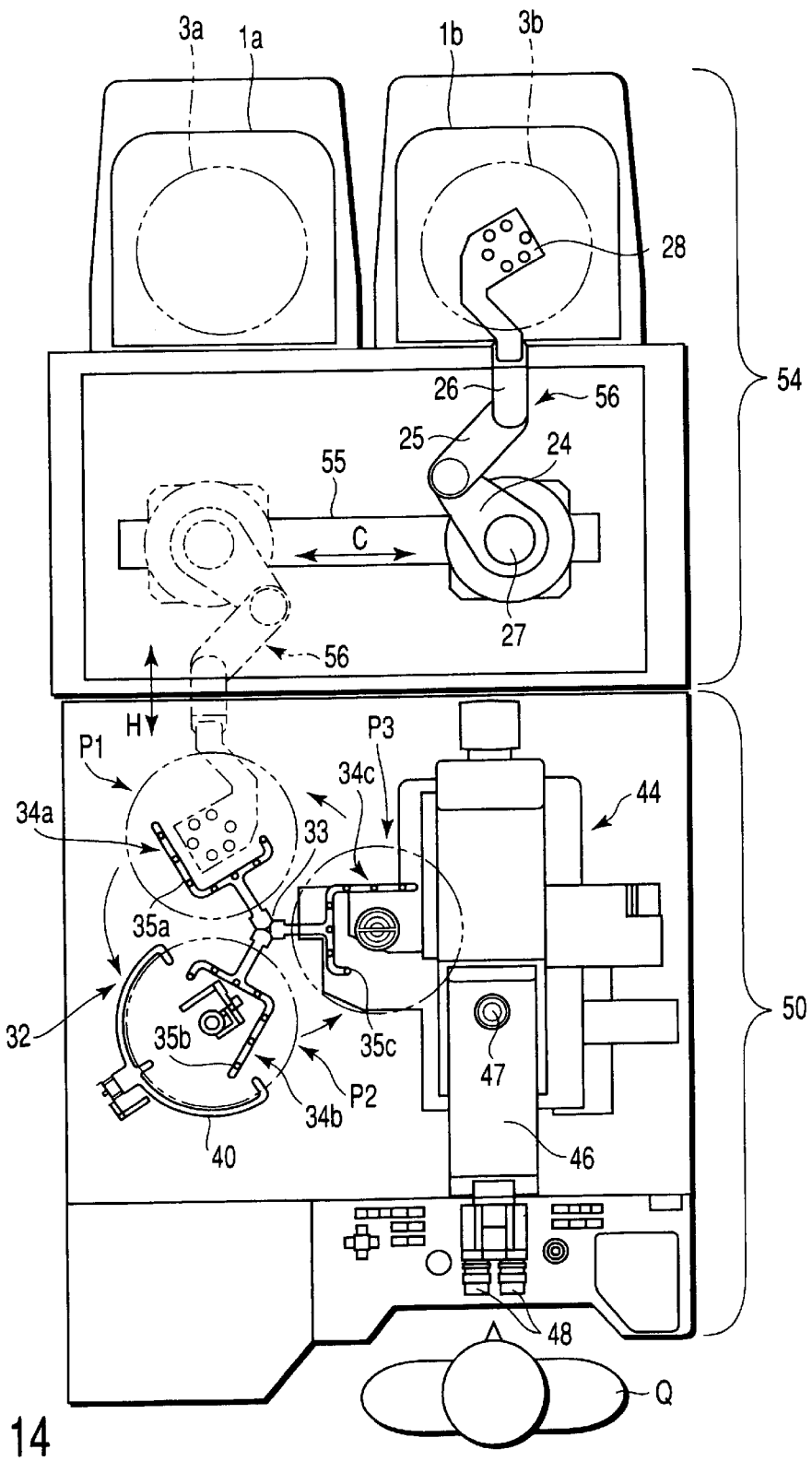
FIG. 14 is a view showing the overall arrangement of an outer appearance inspection apparatus of the seventh specification which uses the substrate transportation apparatus according to the third embodiment of the present invention.

The direction and position with which the loader 54 is to be set with respect to the inspecting section 50 can be changed in accordance with the apparatus layout, as shown in FIG. 13 or 14.

The apparatus layout shown in FIG. 13 corresponds to the sixth specification. According to the sixth specification, the semiconductor wafer 3 is transferred to the inspecting section 50 from the left side. The two wafer carriers 1a and 1b are arranged parallel to the inspecting section 50. Also, the two wafer carriers are provided.

On the loader 54, the wafer transportation robot 56 is driven by the shift mechanism 55 to move in the left-to-right direction (direction of arrow C).

The two wafer carriers 1a and 1b are placed on the front side of the loader 54.

The apparatus layout shown in FIG. 14 corresponds to the seventh specification. According to the seventh specification, the semiconductor wafer 3 is transferred to the inspecting section 50 from the rear side H. Also, the two wafer carriers 1a and 1b are arranged on the rear side of the loader 54.

The loader 54 is arranged on the rear side H of the inspecting section 50. On the loader 54, the wafer transportation robot 56 is driven by the shift mechanism 55 to move in the left-to-right direction (direction of arrow C).

The wafer transportation robot 56 supplies/discharges the semiconductor wafer 3 from/to the rear side (direction of arrow H) of the inspecting section 50.

The two wafer carriers 1a and 1b are placed on the loader 54 at its rear side.

The operations of macroinspection and microinspection at the inspecting section 50 are identical to those of the third and fourth specifications, and a detailed description thereof will be omitted.

With the fifth specification shown in FIG. 12, transfer of the semiconductor wafer 3 by the loader 54 to the inspecting section 50 will be described.

The wafer transportation robot 56 is driven by the shift mechanism 55 to move to a position corresponding to a wafer transfer position $P_1$.

After this, the wafer transportation robot 56 stretches respective connection arms 24 to 26 and a plate-like hand 28 in the direction of arrow A from the left side of the inspecting section 50, and positions the plate-like hand 28 at the wafer transfer position $P_1$ (indicated by a broken line).

When transfer of the semiconductor wafer 3 at the wafer transfer position $P_1$, macroinspection at a macroinspection position $P_2$, and microinspection at a microinspection/transfer position $P_3$ are ended, the wafer transportation apparatus 32 circularly shifts three transportation arms 34a, 34b, and 34c among the wafer transfer position $P_1$, macroinspection position $P_2$, and microinspection/transfer position $P_3$.

The plate-like hand 28 of the wafer transportation robot 56 is positioned in the L-shaped opening of an L-type hand 35c of the transportation arm 34c, and receives the inspected semiconductor wafer 3b from the L-type hand 35c.

While holding the semiconductor wafer 3b, the wafer transportation robot 56 then contracts the connection arms 24 to 26 and plate-like hand 28 in the direction of arrow A from the left side of the inspecting section 50.

Then, the wafer transportation robot 56 is rotated, e.g., counterclockwise, through 180°, and is stopped. The wafer transportation robot 56 then stretches the connection arms 24 to 26 and plate-like hand 28 again to store the semiconductor wafer 3b in the wafer carrier 1b.

Subsequently, with the connection arms 24 to 26 and plate-like hand 28 being contracted, the wafer transportation robot 56 is driven by the shift mechanism 55 to move to a position corresponding to the wafer carrier 1a.

The wafer transportation robot 56 stretches the connection arms 24 to 26 and plate-like hand 28 to draw by suction and hold the uninspected semiconductor wafer 3a stored in the wafer carrier 1a.

The wafer transportation robot 56 contracts the connection arms 24 to 26 and plate-like hand 28, is rotated, e.g., counterclockwise, through 180°, and is stopped. The wafer transportation robot 56 is then driven by the shift mechanism 55 to move to a position corresponding to the wafer transfer position $P_1$.

The wafer transportation robot 56 stretches the connection arms 24 to 26 and plate-like hand 28 again in the direction of arrow A from the left side of the inspecting section 50. The plate-like hand 28 is moved to the wafer transfer position $P_1$ to transfer the uninspected semiconductor wafer 3a to the L-type hand 35c.

With the sixth specification shown in FIG. 13, transfer of the semiconductor wafer 3 by the loader 54 to the inspecting section 50 will be described.

The wafer transportation robot 56 is driven by the shift mechanism 55 to move to the inspecting section 50 side (right side).

When transfer of the semiconductor wafer 3 at the wafer transfer position $P_1$, macroinspection at the macroinspection position $P_2$, and microinspection at the microinspection/transfer position $P_3$ are ended, the wafer transportation apparatus 32 circularly shifts the three transportation arms 34a, 34b, and 34c among the wafer transfer position $P_1$, macroinspection position $P_2$, and microinspection/transfer position $P_3$.

The wafer transportation robot 56 then stretches the connection arms 24 to 26 and plate-like hand 28 in the direction of arrow A from the left side of the inspecting section 50, and positions the plate-like hand 28 at the wafer transfer position $P_1$ (indicated by a broken line).

At this time, the plate-like hand 28 of the wafer transportation robot 56 is positioned in the L-shaped opening of the L-type hand 35c of the transportation arm 34c, and receives the inspected semiconductor wafer 3b from the L-type hand 35c.

While holding the semiconductor wafer 3b, the wafer transportation robot 56 then contracts the connection arms 24 to 26 and plate-like hand 28 in the direction of arrow A from the left side of the inspecting section 50.

Then, the wafer transportation robot 56 is driven by the shift mechanism 55 to move to a position corresponding to the wafer carrier 1b.

The wafer transportation robot 56 stretches the connection arms 24 to 26 and plate-like hand 28 again to store the semiconductor wafer 3b in the wafer carrier 1b.

Subsequently, with the connection arms 24 to 26 and plate-like hand 28 being contracted, the wafer transportation robot 56 is driven by the shift mechanism 55 to move to a position corresponding to the wafer carrier 1a.

The wafer transportation robot 56 stretches the connection arms 24 to 26 and plate-like hand 28 to draw by suction and hold the uninspected semiconductor wafer 3a stored in the wafer carrier 1a.

The wafer transportation robot 56 contracts the connection arms 24 to 26 and plate-like hand 28, and is driven by the shift mechanism 55 to move to the inspecting section 50 side (right side).

Subsequently, movement of the wafer transportation robot 56 by the shift mechanism 55 is stopped at a position corresponding to the wafer transfer position $P_1$.

The wafer transportation robot 56 stretches the connection arms 24 to 26 and plate-like hand 28 again in the direction of arrow A from the left side of the inspecting section 50. The plate-like hand 28 is moved to the wafer transfer position $P_1$.

The wafer transportation robot 56 transfers the uninspected semiconductor wafer 3a to the L-type hand 35c.

With the seventh specification shown in FIG. 14, transfer of the semiconductor wafer 3 by the loader 54 to the inspecting section 50 will be described.

The wafer transportation robot 56 is driven by the shift mechanism 55 to move to the left side of the inspecting section 50. The wafer transportation robot 56 is positioned at a position corresponding to the wafer transfer position $P_1$.

When transfer of the semiconductor wafer 3 at the wafer transfer position $P_1$, macroinspection at the macroinspection position $P_2$, and microinspection at the microinspection/transfer position $P_3$ are ended, the wafer transportation apparatus 32 circularly shifts the three transportation arms 34a, 34b, and 34c among the wafer transfer position $P_1$, macroinspection position $P_2$, and microinspection/transfer position $P_3$.

After this, the wafer transportation robot 56 stretches the connection arms 24 to 26 and plate-like hand 28 in a direction of arrow B from the lower side of the inspecting section 50, and positions the plate-like hand 28 at the wafer transfer position $P_1$ (indicated by a broken line).

At this time, the plate-like hand 28 of the wafer transportation robot 56 is positioned in the L-shaped opening of the L-type hand 35c of the transportation arm 34c, and receives the inspected semiconductor wafer 3b from the L-type hand 35c.

While holding the semiconductor wafer 3b, the wafer transportation robot 56 then contracts the connection arms 24 to 26 and plate-like hand 28 in the direction of arrow B.

Then, the wafer transportation robot 56 is driven by the shift mechanism 55 to move to the right, and is stopped at a position corresponding to the wafer carrier 1b.

The wafer transportation robot 56 then stretches the connection arms 24 to 26 and plate-like hand 28 again to store the semiconductor wafer 3b in the wafer carrier 1b.

Subsequently, with the connection arms 24 to 26 and plate-like hand 28 being contracted, the wafer transportation robot 56 is driven by the shift mechanism 55 to move to the left.

The wafer transportation robot 56 is then stopped at a position corresponding to the wafer carrier 1a.

The wafer transportation robot 56 stretches the connection arms 24 to 26 and plate-like hand 28 to draw by suction and hold the uninspected semiconductor wafer 3a stored in the wafer carrier 1a.

The wafer transportation robot 56 contracts the connection arms 24 to 26 and plate-like hand 28, and is rotated, e.g., counterclockwise, through 180°.

The wafer transportation robot 56 directs and positions its arm at a position corresponding to the wafer transfer position $P_1$.

The wafer transportation robot 56 then stretches the connection arms 24 to 26 and plate-like hand 28 in the direction of arrow B from the rear side H of the inspecting section 50, and moves the plate-like hand 28 to the wafer transfer position $P_1$.

Then, the wafer transportation robot 56 transfers the uninspected semiconductor wafer 3a to the L-type hand 35c.

In this manner, according to the third embodiment, the inspecting section 50 and loader 54 are provided separately to be independent of each other. The inspecting section 50 performs macroinspection and microinspection. The loader 54 supplies/discharges the semiconductor wafer 3 with respect to the inspecting section 50.

Assume that the specification of the apparatus layout in the inspection process at the semiconductor manufacturing factory is changed in design to either one of the fifth to seventh specifications. Even in this case, the direction to supply/discharge the semiconductor wafer 3 can easily be changed to from the left side or rear side of the inspecting section 50.

Therefore, even with the third embodiment, the same effect as that of the first embodiment can be obtained.

The third embodiment can be modified in the following manner.

Figure 15:
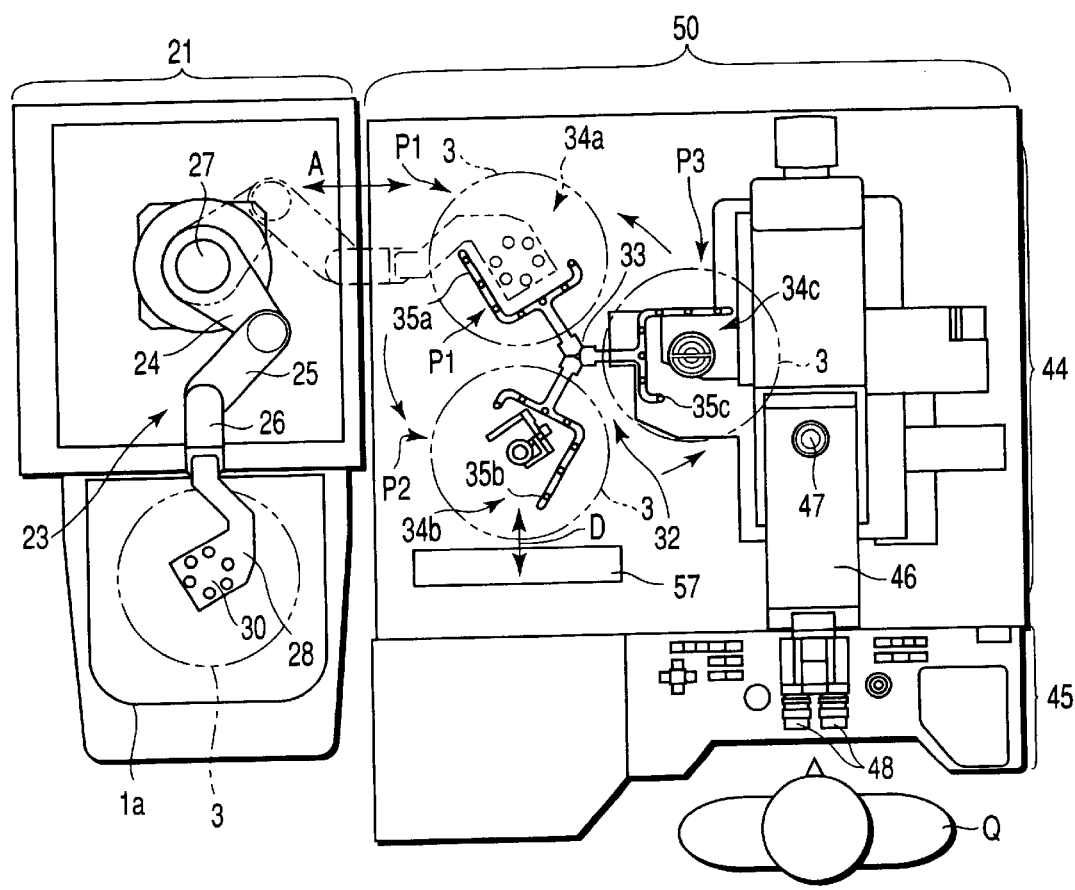
FIG. 15 is a view showing the arrangement of a modification of the substrate transportation apparatus according to the third embodiment of the present invention.

In the third embodiment, a macroinspection swing mechanism 40 is provided for macroinspection. In place of the macroinspection swing mechanism 40, a digital macroinspection unit 57 may be used, as shown in FIG. 15.

The digital macroinspection unit 57 has a line illumination and line sensor. The digital macroinspection unit 57 acquires the image data of the entire surface of a semiconductor wafer 3 while moving in the direction of arrow D, and performs macroinspection of the semiconductor wafer 3 from the image data.

The fourth embodiment of the present invention will be described with reference to the accompanying drawing. In the drawing, the same portions as in FIG. 10 are denoted by the same reference numerals, and a detailed description thereof will be omitted.

Figure 16:
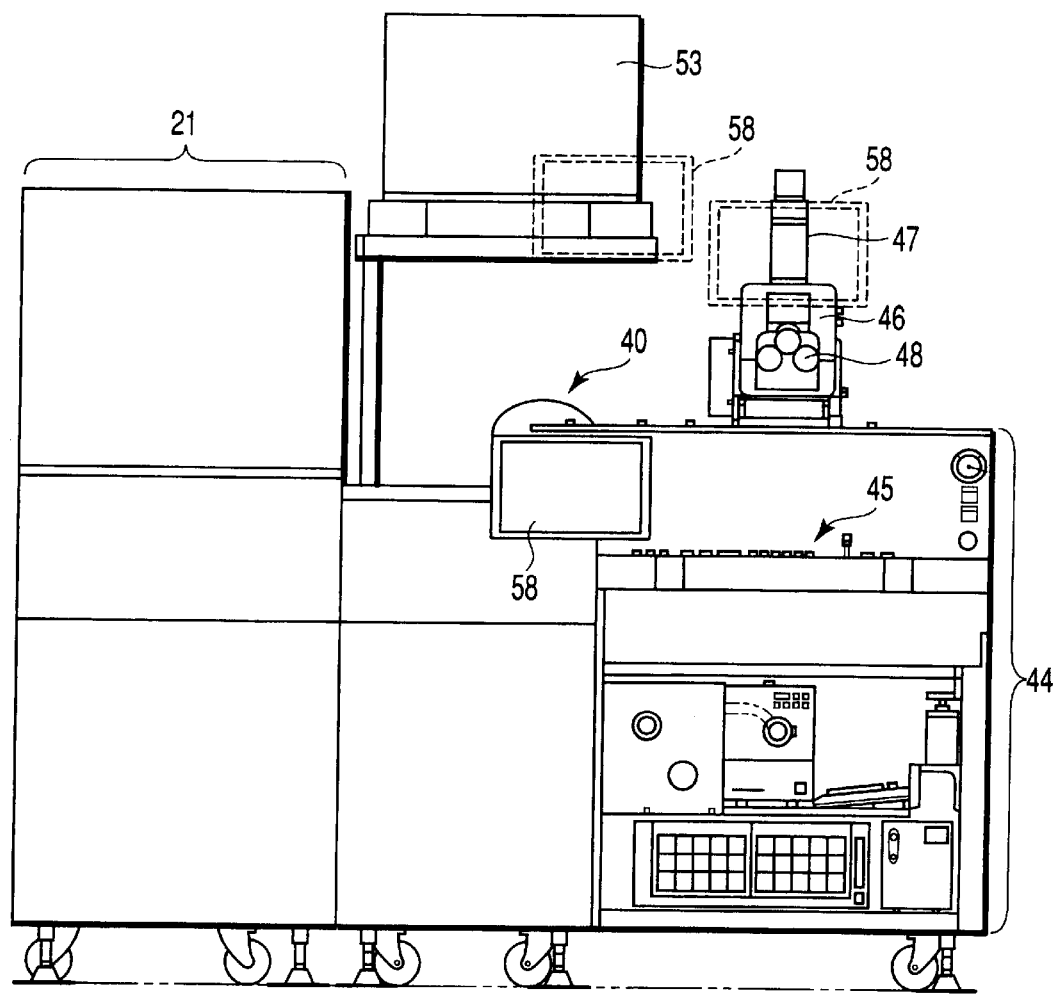
FIG. 16 is a front view of an outer appearance inspection apparatus which uses a substrate transportation apparatus according to the fourth embodiment of the present invention.

FIG. 16 is a view showing the overall arrangement of an outer appearance inspection apparatus using a substrate transportation apparatus. This outer appearance inspection apparatus uses, in place of a monitor 41 provided of a CRT display, a flat monitor 58 formed of, e.g., a liquid crystal display, as a flat panel display.

When compared to a CRT display of the same screen size, the monitor 58 has a very small depth. The monitor 58 serves for both macroinspection and microinspection.

Accordingly, the monitor 58 can be arranged below a viewing range θ between a macroinspection swing mechanism 40 and eyepieces 48 of a microinspection unit 42-1.

Alternatively, the monitor 58 may be arranged in front of a macro illumination unit 53 or above the eyepieces 48.

When compared to the first embodiment, the monitor 58 can be set closer to the eyepieces 48. Assume a case wherein an inspector Q performs macroinspection and microinspection. Assume a case wherein an actual semiconductor wafer 3a is to be microobserved through the eyepieces 48. Also assume a case wherein the inspection results of macroinspection and microinspection are to be input. In these cases, the moving range of the glance of the inspector Q can be reduced, and the cumbersomeness of observation can be reduced.

According to the fourth embodiment described above, the monitor 58 is arranged on the left side to be adjacent to the macroinspection swing mechanism 40. However, the position of the monitor 58 is not limited to this.

In the first to fourth embodiments described above, the eyepieces 48 of the microscope 46 may be eliminated, and a monitor 41 provided of a CRT display or a monitor 58 formed of a liquid crystal display may be provided at this position.

The inspector Q observes the semiconductor wafer 3a on the macroinspection swing mechanism 40 to perform macroinspection. The inspector Q also observes the enlarged image of the semiconductor wafer 3a displayed on the monitor 41 or 58 to perform microinspection. The inspector Q can further reduce the moving range of his glance.

Figure 17:
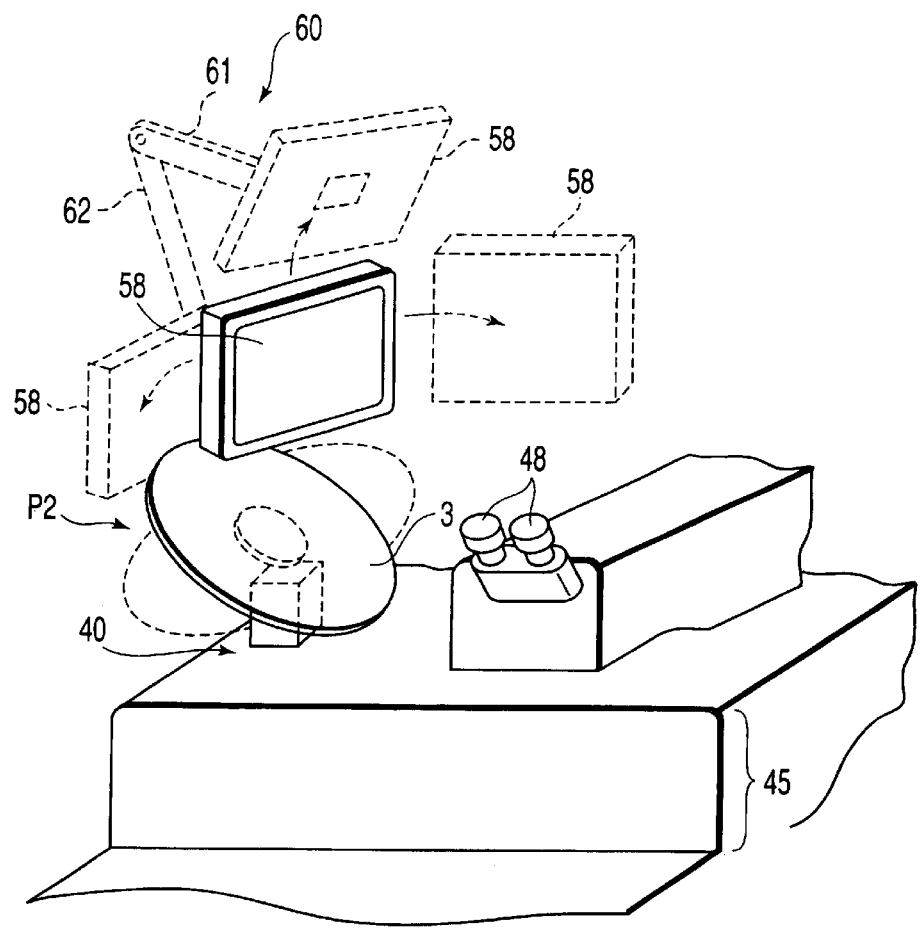
FIG. 17 is a view showing the arrangement of a modification of the substrate transportation apparatus according to the present invention.

In FIG. 17, a monitor 58 formed of a liquid crystal display serving as a flat panel display is provided to a movable mechanism 60. With the movable mechanism 60, the monitor 58 is movably arranged above a macroinspection swing mechanism 40.

The movable mechanism 60 is formed by connecting, e.g., two link arms 61 and 62, and has the monitor 58 at its distal end. The movable mechanism 60 moves the screen position of the monitor 58 vertically and horizontally.

An inspector Q can adjust the screen position of the monitor 58 at the optimum position so he can watch it easily.

The position of the monitor 58 can be moved in this manner. Thus, when performing macroinspection of a semiconductor wafer 3, the inspector Q can freely arrange the screen position of the monitor 58 to a position where observation can be performed easily.

Figure 18:
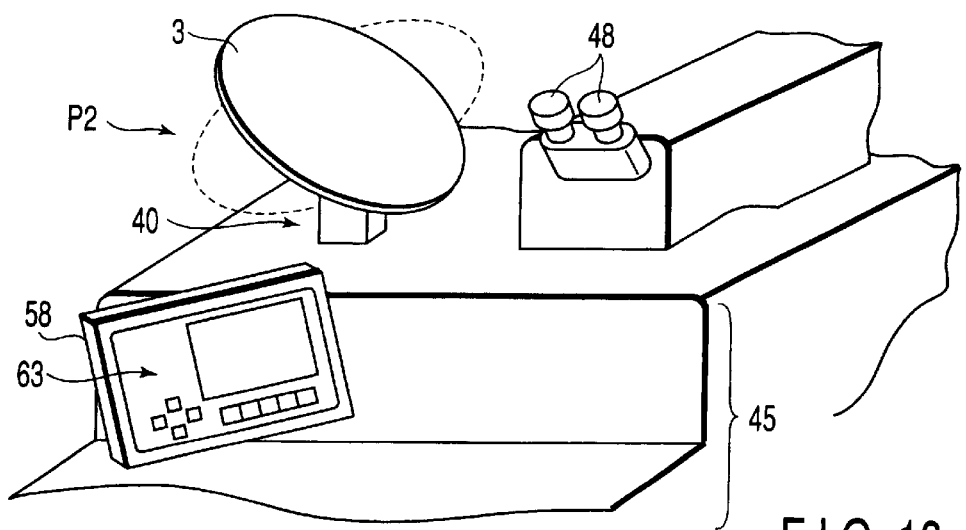
FIG. 18 is a view showing the arrangement of a modification of the substrate transportation apparatus according to the present invention.

FIG. 18 is a view showing the position of another monitor 58. The monitor 58 is arranged under a macroinspection swing mechanism 40 and on an operating section 45. Input operation concerning the operations of macroinspection and microinspection are performed at the operating section 45.

The monitor 58 displays the operation functions of macroinspection and microinspection. More specifically, the monitor 58 has, e.g., a touch panel function. The monitor 58 displays an operation window (displaying operation switches) 63 of macroinspection and microinspection. The operations of macroinspection and microinspection are performed by touch operation of the inspector Q.

The present invention is not limited to the first to fourth embodiments described above, but in practicing the present invention, various modifications can made within the spirit and scope without departing from the invention.

Furthermore, the first to fourth embodiments incorporate inventions of various stages. The various inventions can be extracted through appropriate combinations of a plurality of disclosed constituent elements. For example, assume that even if several constituent elements are removed from the whole constituent elements described in the embodiments, the problem described in the column of the problem to be solved by the invention can be solved, and the effect described in the column of the effect of the present invention can be obtained. In this case, an arrangement from which these constituent elements are removed can be extracted as an invention.

The first to fourth embodiments can be modified in the following manner.

For example, in the first to fourth embodiments, a case is described wherein a substrate transportation apparatus is applied to an outer appearance inspection apparatus. However, the present invention is not limited to this, but can be applied to all of various types of manufacturing apparatuses and various types of inspection apparatuses of a semiconductor manufacturing line as far as they transfer a substrate such as a semiconductor wafer 3.

As the articulated wafer transportation robot 23, a two-shaft direct-drive robot which linearly moves in the X and Y directions can also be used instead. The wafer transportation robot 23 can be replaced with a single- or double-arm articulated manipulator.

The wafer transportation apparatus 32 is not limited to one using the three transportation arms 34a, 34b, and 34c, but one using a plurality of transportation arms, e.g., two arms or four arms, can be used.

The shape of the wafer transportation robot 23 and the shapes of the hands of the wafer transportation apparatus 32 are not limited to a substantially L shape in which an intersecting portion where two sides intersect is curved. Alternatively, a substantially L shape in which an intersecting portion where two sides intersect is curved, or a crescent shape in which two sides are connected to each other through a curve can be formed.

The wafer transportation robot 23 extracts or stores the semiconductor wafer 3 from or in the wafer carrier 1a or 1b. Alternatively, the wafer transportation robot 23 may directly extract a semiconductor wafer 3 flowing in the line of a semiconductor manufacturing factory, or may return it to the line.

The direction in which the semiconductor wafer 3 is transferred with respect to the macroinspection/transportation section 22 or inspecting section 50 is not limited to either one of the two directions of from left side and rear side of the macroinspection/transportation section 22 or inspecting section 50. For example, the semiconductor wafer 3 may be transferred from both the left side and rear side alternately. If the outer shape of the macroinspection/transportation section 22 or inspecting section 50 is changed, the semiconductor wafer 3 can be transferred in two or more directions.

The substrate to be inspected is not limited to the semiconductor wafer 3, but can be a glass substrate for a liquid crystal display.

Figure 19:
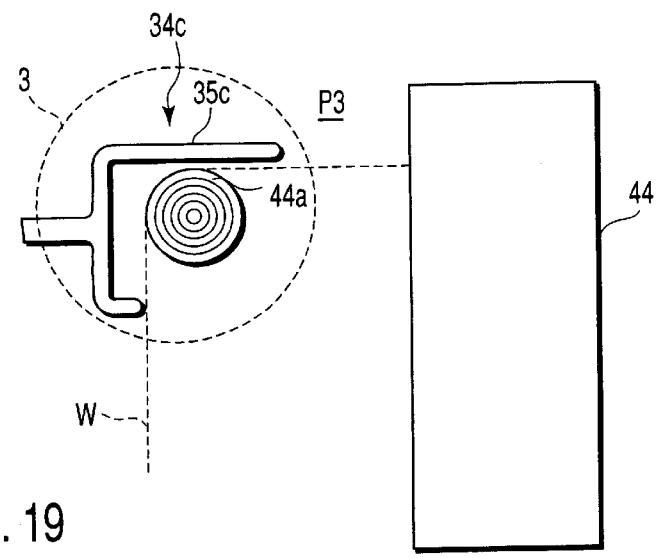
FIG. 19 is a view showing the movable range of a substrate drawing portion of the substrate transportation apparatus according to the present invention.
Figure 20:
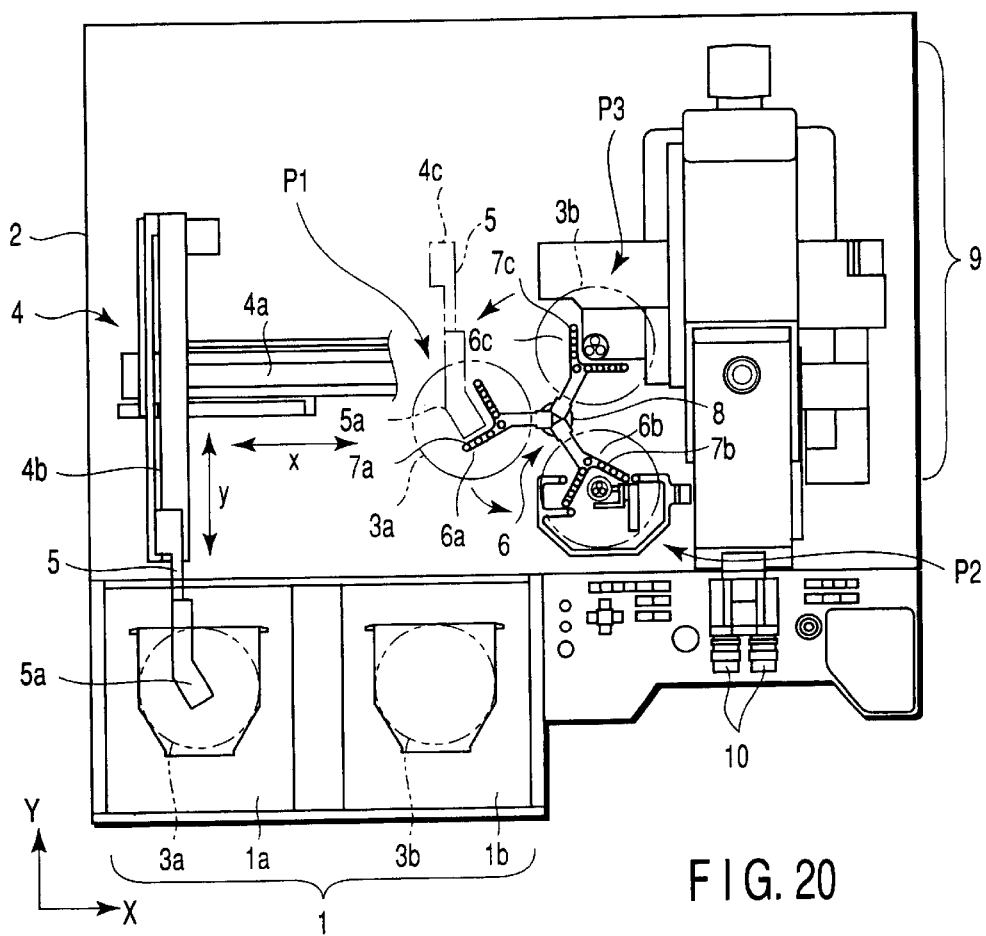
FIG. 20 is a view showing the arrangement of a conventional outer appearance inspection apparatus.

The microinspection section 44 has the substrate drawing portion 44a of the microinspection X-Y stage 44b, as shown in FIG. 19. The substrate drawing portion 44a transfers the semiconductor wafer 3 with respect to, e.g., the L-type hand 35c of the transportation arm 34c.

The substrate drawing portion 44a is movable within a movable range W.

Thus, the L-type hand 35c may be positioned to be within the movable range W.

The present invention is applied to an apparatus for inspecting and measuring a semiconductor wafer or a glass substrate for a flat panel display such as a liquid crystal display by visual observation or using a microscope. The loader 21 and macroinspection/transportation section 22 are separate to be independent of each other. The loader 21 can be arranged in two transfer directions corresponding to the first and second specifications with respect to the macroinspection/transportation section 22.

According to the present invention, the apparatus layout can be easily adapted to various types of specifications in accordance with the arrangement of a transportation path in the facilities or the shape of a space in the facilities.

What is claimed is:

1. A substrate transportation apparatus comprising
   a first transportation section which extracts/stores a substrate from/in a storing container that stores the substrate, and a second transportation section which transfers the substrate with respect to said first transportation section and transfers the substrate with respect to an apparatus unit that performs a desired process for the substrate, wherein said second transportation section has a rotation arm which is circularly transported between a substrate transfer position with respect to said first transportation section and a substrate transfer position with respect to the apparatus unit, said first transportation section is separated from said second transportation section, and a transfer position with respect to the rotation arm is located within a transportation stroke range for said first transportation section with respect to two different directions such that said first transportation section can be selectively arranged with respect to said second transportation section in the two different directions.

2. A substrate transportation apparatus according to claim 1, wherein said second transportation section is integrated with the apparatus unit, the transfer position with respect to the rotation arm is set at a same distance from two adjacent side surfaces of the apparatus unit, and said first transportation section can be arranged on the two adjacent side surfaces.

3. A substrate transportation apparatus according to claim 1, wherein an interval between said first transportation section and the transfer position with respect to the rotation arm is set within the transportation stroke range for said first transportation section.

4. A substrate transportation apparatus according to claim 1, wherein an alignment sensor which detects an outer peripheral edge of the substrate in order to align a central position of the substrate is arranged at the substrate transfer position of the second transportation section.

5. A substrate transportation apparatus according to claim 1, wherein an arm of said first transportation section or the arm of said second transportation section has a hand formed in a substantially L shape to draw and hold the substrate by suction, and a line that connects two suction holes formed at two edges of the substantially L-shaped hand is located outside a center of the substrate.

6. A substrate transportation apparatus according to claim 1, wherein an arm of said first transportation section and the arm of said second transportation section have each a hand formed in a substantially L shape to draw by suction and hold the substrate, the hand of said second transportation section is arranged at the substrate transfer position not to interfere with the hand of said first transportation section upon inserting the hand of said first transportation section from the two different directions, and a line that connects two suction holes formed at two edges of each of the hands is located outside a center of the substrate.

7. A substrate transportation apparatus according to claim 1, wherein said first transportation section includes an articulated-type transfer robot having a plurality of connection arms, and said apparatus includes a first hand formed with a curve at a distal end of said connection arms of the transfer robot to draw by suction and hold the substrate, a second hand connected to a distal end of the rotation arm and formed in a substantially L shape with a transfer space where said first hand is to enter from the two directions, to draw and hold the substrate by suction, and a relief which avoids interference with a long side of said second hand when said first hand transfers the substrate from an insertion direction of the long side of said second hand.

8. A substrate transportation apparatus used for performing macroobservation of inspecting a defect on a substrate by visual observation and various types of inspection and measurement for the substrate, comprising:

a first transportation section which extracts/stores the substrate from/in a storing container that stores the substrate, and a second transportation section which transfers the substrate with respect to said first transportation section and transfers the substrate with respect to an apparatus unit that performs a desired process for the substrate, wherein said first transportation section includes a stretchable/contractible articulated arm in which a plurality of arms are connected, and a first hand formed with a curve at a distal end of said articulated arm to draw and hold the substrate by suction, said second transportation section includes a rotating shaft which rotates around an axial direction as a center, and three transportation arms formed on said rotating shaft at equiangular intervals and each having a second hand with a substantially L shape with a transfer space where said first hand is to enter, to draw by suction and hold the substrate, said three transportation arms are rotated around said rotating shaft as a center to circularly shift among a transfer position with respect to said first transportation section, a position for macroobservation, and a transfer position with respect to said second transfer section, said first and second transportation sections are separate to be independent of each other, said first transportation section is formed with respect to said second transportation section in a first transfer direction or a second transfer direction different from the first transfer direction by substantially 90°, the apparatus unit includes various types of units including a microinspection unit which enlarges the substrate by a microscope and observes an enlarged image of the substrate, and a thickness measurement unit which measures a thickness of a film formed on the substrate, and either one of the two units is incorporated in said second transportation section.

\* \* \* \* \*